(12) United States Patent
Yashiro et al.

(10) Patent No.: US 7,157,659 B2
(45) Date of Patent: Jan. 2, 2007

(54) PLASMA PROCESSING METHOD AND APPARATUS

(75) Inventors: Yoichiro Yashiro, Ibaraki (JP);
Tomohiro Okumura, Kadoma (JP);
Tadashi Kimura, Kobe (JP); Mitsuo Saitoh, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 588 days.

(21) Appl. No.: 10/647,479

(22) Filed: Aug. 26, 2003

(65) Prior Publication Data

US 2004/0096581 A1 May 20, 2004

(30) Foreign Application Priority Data

Aug. 26, 2002 (JP) ............................. 2002-244698
Aug. 28, 2002 (JP) ............................. 2002-248246

(51) Int. Cl.
*B23K 10/00* (2006.01)
(52) U.S. Cl. ........................ 219/121.43; 219/121.48; 219/121.52; 315/111.21
(58) Field of Classification Search ........... 219/121.52, 219/121.59, 121.48, 121.61, 121.41, 121.43; 315/111.21; 313/231.31; 118/723 R
See application file for complete search history.

(56) References Cited

U.S. PATENT DOCUMENTS

| | | | | | |
|---|---|---|---|---|---|
| 3,786,306 | A | * | 1/1974 | Schoumaker | ............ 315/111.21 |
| 5,391,855 | A | * | 2/1995 | Tanisaki | ................. 219/121.43 |
| 5,464,476 | A | * | 11/1995 | Gibb et al. | ............ 118/723 MP |
| 5,549,780 | A | * | 8/1996 | Koinuma et al. | ....... 156/345.39 |

* cited by examiner

*Primary Examiner*—Mark Paschall
(74) *Attorney, Agent, or Firm*—Wenderoth, Lind & Ponack, L.L.P.

(57) ABSTRACT

In a state that a plate-shaped insulator is disposed adjacent to a plate-shaped electrode, a discharge gas containing an inert gas is supplied to a vicinity of a processing object from one gas exhaust port located nearer from the plate-shaped electrode, out of at least two-line gas exhaust ports which are disposed around the plate-shaped electrode and which are formed so as to be surrounded by the plate-shaped insulator and moreover which are different in distance to the plate-shaped electrode from each other, while a discharge control gas is supplied from the other gas exhaust port to the vicinity of the processing object. Simultaneously with the supply of the gases, electric power is supplied to the plate-shaped electrode or the processing object, by which plasma processing of the processing object is carried out. Thus, plasma processing method and apparatus capable of processing for desired fine linear portions with high precision are provided.

6 Claims, 18 Drawing Sheets a = 1mm
b = 1mm a = 1mm
b = 2mm a = 1mm
b = 0.5mm

PLASMA PROCESSING METHOD AND APPARATUS

BACKGROUND OF THE INVENTION

The present invention relates to plasma processing method and apparatus for performing plasma processing by using a plasma on, for example, processing objects (objects to be processed) such as a substrate having a thin film formed on its surface or processing objects coated with various types of films so that desired fine linear portions are worked with high precision, or for performing plasma processing by using a plasma on the surface of various processing objects so that a thin film is deposited thereon.

In general, when an object to be processed typified by a substrate with a thin film formed thereon is subjected to a patterning process, a resist process is used. FIGS. 7A to 7D show one example of the process. In FIGS. 7A to 7D, first, photosensitive resist 14 is applied onto the surface of an object 12 to be processed (FIG. 7A). Next, the resist 14 is exposed to light with an exposer and thereafter developed, by which the resist 14 can be patterned into a desired configuration (FIG. 7B). Further, with the object 12 placed in a vacuum chamber, a plasma is generated in the vacuum chamber and the processing object 12 is etched with the resist 14 used as a mask, by which the surface of the processing object 12 is patterned into a desired configuration (FIG. 7C). Finally, the resist 14 is removed with an oxygen plasma, organic solvent, or the like, thereby the processing is completed (FIG. 7D).

The above-described resist process, which is suitable for forming a fine pattern with high precision, has come to play an important role in manufacturing semiconductors or other electronic devices. However, there is a defect that the process is complicated.

Accordingly, new plasma processing methods without the use of any resist process have been under discussions. As an example thereof, a plasma source that linearly generates a plasma will be described with reference to FIGS. 8 and 9. FIG. 8 shows a perspective view of a plasma processing apparatus that has a plasma source with a plate-shaped electrode 1 mounted thereon, and FIG. 9 shows a sectional view taken along the plane PP of FIG. 8. In FIGS. 8 and 9, plate-shaped insulators 2, 3 are disposed at positions where the plate-shaped electrode 1 and their plate surfaces become mutually parallel, and gas can be supplied generally perpendicularly to the processing object 12 from a gas supply unit 10 via a gas passage 6. By applying a high-frequency power of 13.56 MHz to the plate-shaped electrode 1 from a high-frequency power supply 13 while supplying the gas from the gas supply unit 10, a plasma is generated between the plasma source including the plate-shaped electrode 1 and the processing object 12, so that the processing object 12 can be processed with the plasma. A distance "a" between the plasma source and the processing object 12 is 0.3 mm, thicknesses "b" and "c" of the plate-shaped electrode 1 and the plate-shaped insulators 2, 3 are both 1 mm, a width "e" of the gas passage 6 is 0.1 mm, and an angle of a pointing edge portion "i" of the plate-shaped electrode 1 is 60°. Also, the plate surface of the plate-shaped electrode 1 has a height "g" of 50 mm and a length "h" of 30 mm in the line direction.

For example, under the conditions that He is supplied by 1000 sccm and $SF_6$ is supplied by 10 sccm as gas to the gas passage 6 and a high-frequency power of 100 W is supplied, as the object 12 of Si to be processed can be etched.

However, the etching by the plasma processing method and apparatus described in connection with the prior art example has had an issue that the object would be processed over a wide range beyond desired fine linear portions. A resultant etching profile is shown in FIG. 10. In this case, given a depth D of the portion that is most deeply etched, if the width of a portion shallower than the pattern bottom by D×0.8 is a processing width E, then E was 2.1 mm. Since the thickness of the plate-shaped electrode 1 of the plasma source is 1 mm, the processing width E resulted in about its double.

SUMMARY OF THE INVENTION

In view of the aforementioned conventional issues, an object of the present invention is to provide a plasma processing method and apparatus capable of processing desired fine linear portions with high precision.

In order to achieve the above object, the present invention has the following constitution.

According to a first aspect of the present invention, there is provided a plasma processing method for processing a processing object with a plasma, the method including: in a state that a plate-shaped insulator is disposed adjacent to a plate-shaped electrode disposable opposite to the processing object under a pressure around atmospheric pressure, supplying a discharge gas containing an inert gas to a vicinity of the processing object from one gas exhaust port located nearer from the plate-shaped electrode, out of at least two-line gas exhaust ports which are disposed around the plate-shaped electrode and which are formed so as to be surrounded by the plate-shaped insulator and moreover which are different in distance to the plate-shaped electrode from each other, while supplying a discharge control gas from the other gas exhaust port to the vicinity of the processing object; and, simultaneously with the supply of the gases, supplying electric power to the plate-shaped electrode or the processing object.

According to a second aspect of the present invention, there is provided the plasma processing method according to the first aspect, wherein the discharge control gas supplied from the gas exhaust port farther from the plate-shaped electrode out of the at least two-line gas exhaust ports contains a gas having a discharge-starting voltage larger than that of the inert gas.

According to a third aspect of the present invention, there is provided the plasma processing method according to the first aspect, wherein in a state where a line-direction opening length of the gas exhaust port for the discharge gas located nearer from the plate-shaped electrode is smaller than a line-direction opening length of the gas exhaust port for the discharge control gas located farther from the plate-shaped electrode, the plasma processing of the processing object allows to be carried out while the discharge control gas exhausted from the gas exhaust port for the discharge control gas is maintained present around the discharge gas exhausted from the gas exhaust port for the discharge gas.

According to a fourth aspect of the present invention, there is provided the plasma processing method according to any one of the first through third aspects, wherein the inert gas is any one of He, Ar, Ne, and Xe.

According to a fifth aspect of the present invention, there is provided the plasma processing method according to any one of the first through third aspects, wherein the discharge control gas larger in discharge-starting voltage than the inert gas is a halogen-containing gas such as $SF_6$, $CF_4$, or other CxFy (where x and y are natural numbers), $NF_3$, $O_2$, $Cl_2$, and HBr, as a reactive, etching gas.

According to a sixth aspect of the present invention, there is provided the plasma processing method according to any one of the first through third aspects, wherein the discharge control gas larger in discharge-starting voltage than the inert gas is a gas having a He concentration of less than 50%.

According to a seventh aspect of the present invention, there is provided the plasma processing method according to any one of the first through third aspects, wherein the processing object is processed with the plasma in a state where the discharge control gas larger in discharge-starting voltage than the inert gas is a gas having a property of suppressing electric discharge in a vicinity of the gas exhaust port located farther from the plate-shaped electrode.

According to an eighth aspect of the present invention, there is provided the plasma processing method according to any one of the first through third aspects, wherein the processing object is processed with the plasma in a state where the discharge control gas larger in discharge-starting voltage than the inert gas is a gas having a property that a width of linear discharge becomes narrower, compared with a case where a flow of the gas is not provided.

According to a ninth aspect of the present invention, there is provided the plasma processing method according to any one of the first through eighth aspects, wherein the processing object is processed with the plasma in a state where a part of a surface of the plate-shaped insulator confronting the processing object has a taper portion.

According to a 10th aspect of the present invention, there is provided the plasma processing method according to any one of the first through ninth aspects, wherein the processing object is processed with the plasma in a state where a distance between the processing object and the gas exhaust port for the discharge control gas located farther from the plate-shaped electrode is smaller than a distance between the processing object and the gas exhaust port for the discharge gas located nearer from the plate-shaped electrode.

According to an 11th aspect of the present invention, there is provided the plasma processing method according to the tenth aspect, wherein assuming that a distance between the processing object and the gas exhaust port for the discharge control gas located farther from the plate-shaped electrode is m and that a distance between the processing object and the gas exhaust port for the discharge gas located nearer from the plate-shaped electrode is k, then it holds that 0 mm<k−m≦1 mm.

According to a 12th aspect of the present invention, there is provided a plasma processing apparatus comprising:

a plate-shaped electrode;

a plate-shaped insulator placed at a position where the plate-shaped insulator is adjacent to the plate-shaped electrode and where the plate-shaped insulator does not cover a part of a surface of the plate-shaped electrode confronting a processing object;

an electric power supply unit for supplying electric power to the plate-shaped electrode or the processing object;

a discharge-gas supply unit for supplying a discharge gas containing an inert gas to one gas exhaust port located nearer from the plate-shaped electrode, out of at least two-line gas exhaust ports which are disposed near the plate-shaped electrode and which are different in distance to the plate-shaped electrode from each other; and a discharge-control gas supply unit for supplying a discharge control gas, which is larger in discharge-starting voltage than the inert gas, to one gas exhaust port located farther from the plate-shaped electrode, out of the at least two-line gas exhaust ports which are disposed near the plate-shaped electrode and which are different in distance to the plate-shaped electrode from each other.

According to a 13th aspect of the present invention, there is provided the plasma processing apparatus according to the 12th aspect, wherein at least a surface of the plate-shaped electrode confronting the processing object has a taper portion.

According to a 14th aspect of the present invention, there is provided the plasma processing apparatus according to the 12th or 13th aspect, wherein a line-direction opening length of the gas exhaust port for the discharge gas located nearer from the plate-shaped electrode is smaller than a line-direction opening length of the gas exhaust port for the discharge control gas located farther from the plate-shaped electrode.

According to a 15th aspect of the present invention, there is provided the plasma processing apparatus according to any one of the 12th through 14th aspects, wherein a part of a surface of the plate-shaped insulator confronting the processing object has a taper portion.

According to a 16th aspect of the present invention, there is provided the plasma processing apparatus according to any one of the 12th through 14th aspects, wherein a distance between the processing object and the gas exhaust port for the discharge control gas located farther from the plate-shaped electrode is smaller than a distance between the processing object and the gas exhaust port for the discharge gas located nearer from the plate-shaped electrode.

According to a 17th aspect of the present invention, there is provided the plasma processing apparatus according to the 16th aspect, wherein assuming that the distance between the processing object and the gas exhaust port for the discharge control gas located farther from the plate-shaped electrode is m and that the distance between the processing object and the gas exhaust port for the discharge gas located nearer from the plate-shaped electrode is k, then it holds that 0 mm<k−m≦1 mm.

According to the present invention, there is provided the plasma processing method in which with the plate-shaped electrode and the plate-shaped insulator disposed adjacent to the plate-shaped electrode under the pressure around atmospheric pressure, gases are supplied to a vicinity of the processing object from at least two gas exhaust ports which are disposed around the plate-shaped electrode and which are different in distance to the plate-shaped electrode from each other, while, simultaneously with the supply of the gases, electric power is supplied to the plate-shaped electrode or the processing object. A discharge gas containing an inert gas is supplied from one gas exhaust port located nearer from the plate-shaped electrode, and a discharge control gas containing a gas larger in discharge-starting voltage than the inert gas is supplied from the gas exhaust port located farther from the plate-shaped electrode, while simultaneously with the supply of the gases, plasma processing is carried out. Thus, there can be realized a plasma processing method capable of processing for desired fine linear portions at high precision without using any mask of resist or the like.

According to the present invention, there is provided the plasma processing apparatus which comprises the plate-shaped electrode, the plate-shaped insulator placed adjacent to the plate-shaped electrode, the gas supply units, and the electric power supply unit, the plasma processing apparatus further having the at least two gas exhaust ports, i.e. the discharge-gas exhaust port and the discharge-control-gas exhaust port, placed in the vicinity of the plate-shaped electrode, where the individual gas exhaust ports are different in distance to the plate-shaped electrode from each other. Thus, there can be realized a plasma processing apparatus capable of processing for desired fine linear portions at high precision without using any mask of resist or the like.

According to the present invention, there is provided the plasma processing apparatus which comprises the micro plasma source disposed adjacent to the processing object, the electric power supply, and the jet-out port (gas exhaust port) for supplying active particles which are made to act on the processing object, where an outer side face of the jet-out port is formed into a tapered configuration as one example. Since the inclusion of the jet-out port having the outer side face of the tapered configuration allows the diffusion of radicals to be controlled, there can be provided a plasma processing apparatus capable of suppressing bleeding in the processing region and excellent in processing precision.

According to the present invention, there is provided the plasma processing method in which the gas for plasma processing is supplied to the micro plasma source disposed in a vicinity of the processing object, and the electric power is applied to the electrode, by which a micro plasma is generated, where with the jet-out port of the tapered configuration, active particles supplied from the micro plasma source are thrown from the jet-out port to act on the processing object, thereby achieving plasma processing of the processing object. Since the use of the jet-out port of the tapered configuration allows the diffusion of radicals to be controlled, there can be provided a plasma processing method capable of suppressing bleeding in the processing region and excellent in processing precision.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
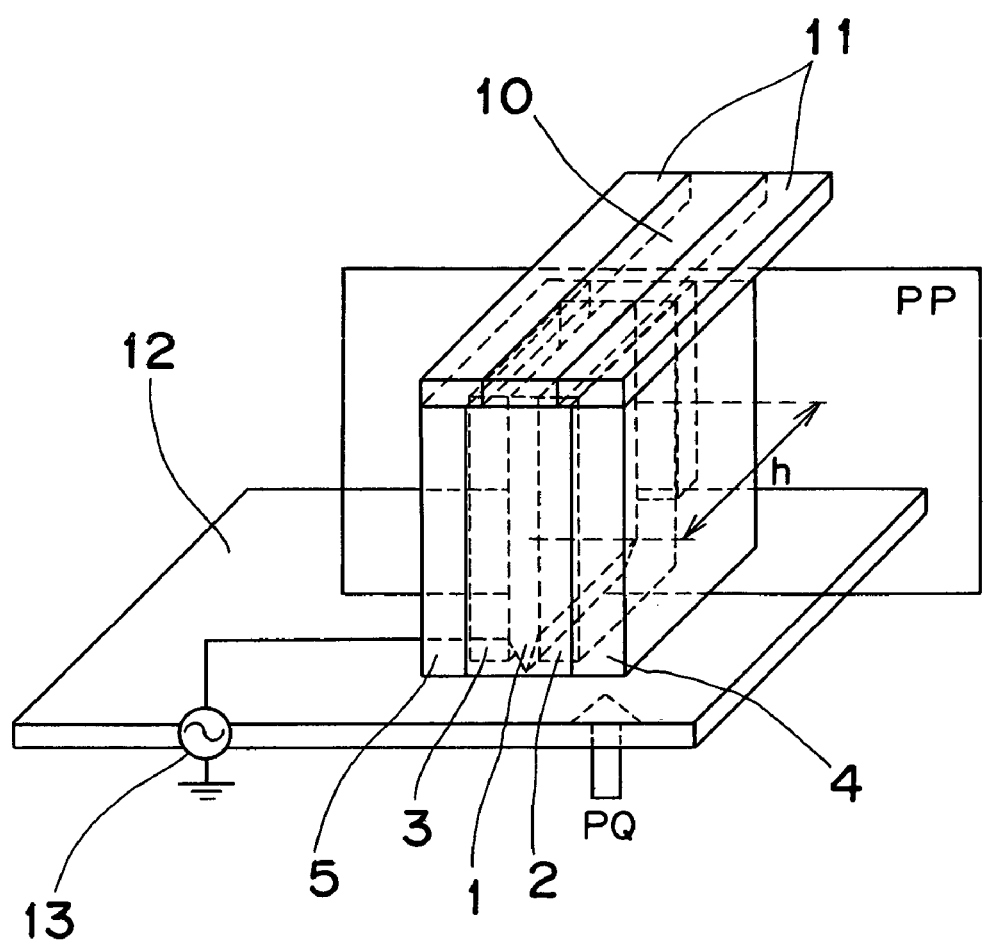
FIG. 1 is a perspective view showing the construction of a plasma processing apparatus employed in a first embodiment of the present invention.

Before the description of the present invention proceeds, it is to be noted that like parts are designated by like reference numerals throughout the accompanying drawings.

Hereinbelow, embodiments of the present invention are described in detail with reference to the accompanying drawings.

A first embodiment of the present invention is described below with reference to FIGS. 1 to 5.

Figure 2:
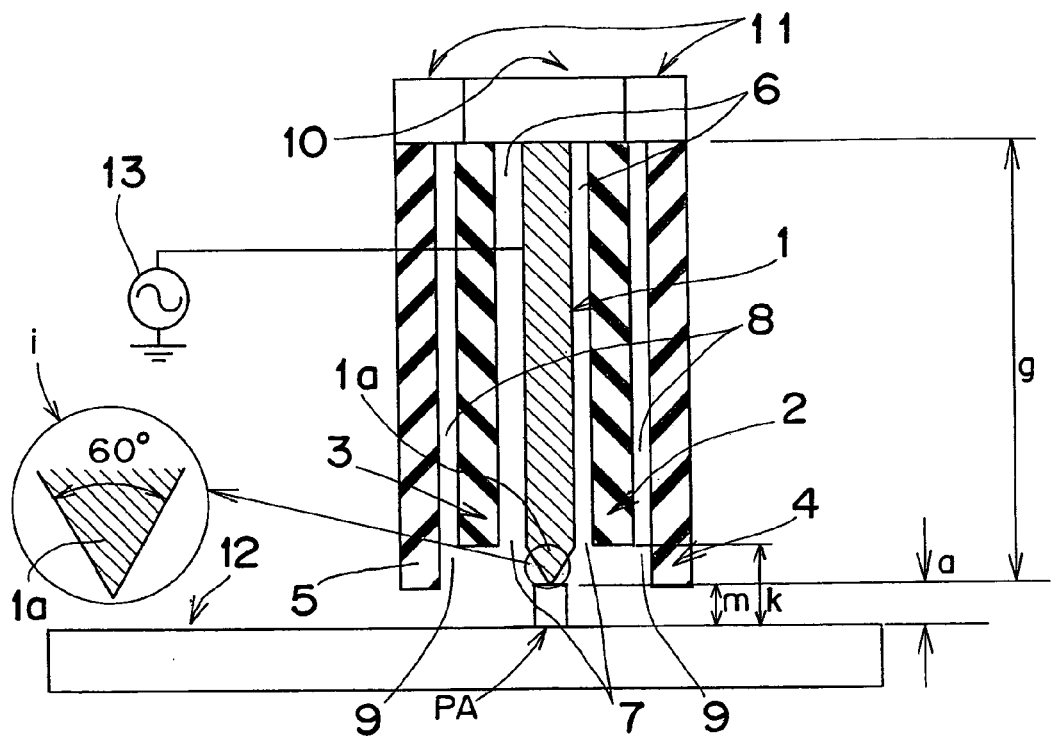
FIG. 2 is a sectional view taken along the plane PP of FIG. 1, showing the construction of the plasma processing apparatus employed in the first embodiment of the present invention.

FIG. 1 shows a perspective view of a plasma processing apparatus including a plasma source equipped with a plate-shaped electrode 1 employed in the first embodiment of the present invention, in which a triangular-shaped taper portion (acute-angle portion) 1a having a thicknesswise symmetrical taper portion is provided at its lower end (an end portion on one side confronting the processing object [object to be processed]). FIG. 2 shows a sectional view taken along the plane PP of FIG. 1. Also, FIG. 3 is a plan view as viewed in a PQ direction of FIG. 1, showing the surface having the taper portion 1a of the plate-shaped electrode 1.

Figure 3:
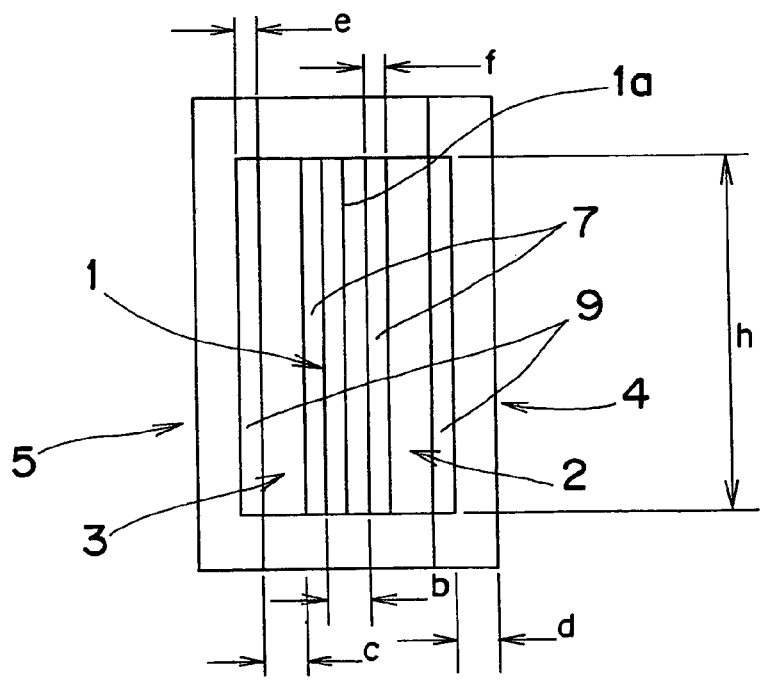
FIG. 3 is a plan view as viewed in a PQ direction of FIG. 1, showing the construction of the plasma processing apparatus employed in the first embodiment of the present invention, in a state that no object to be processed is provided.
Figure 4:
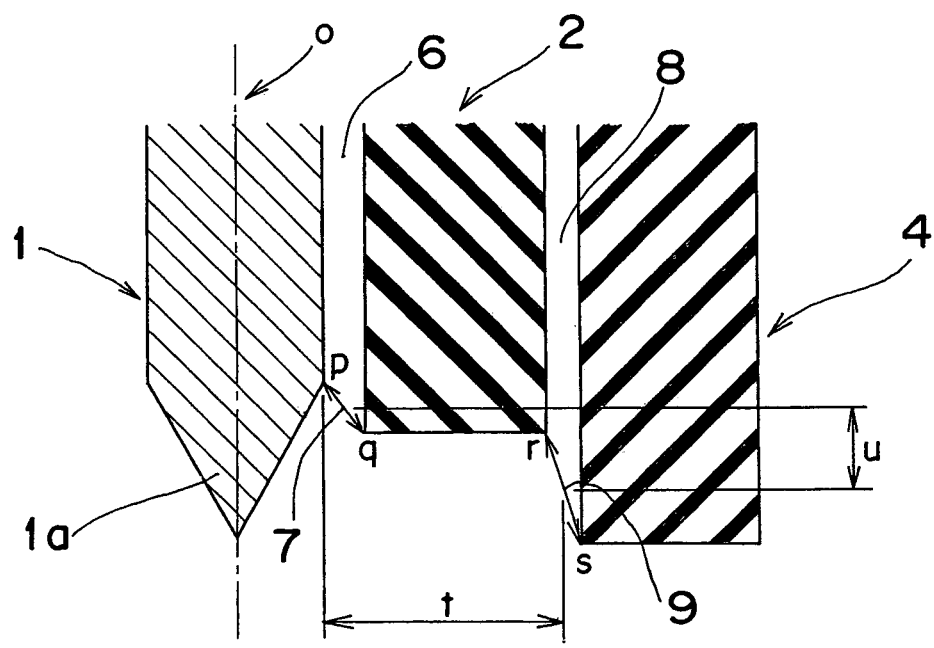
FIG. 4 is an enlarged view showing a vicinity of a taper portion of the plate-shaped electrode employed in the first embodiment of the present invention.
Figure 5:
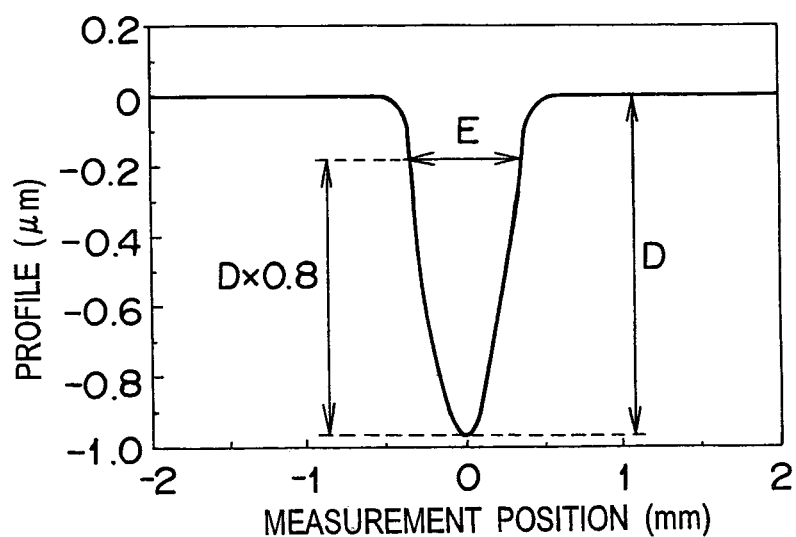
FIG. 5 is a graph showing an etching profile in the first embodiment of the present invention.

Referring to FIGS. 1 to 3, rectangular-parallelopiped plate-shaped insulators 2, 3 and C- or bracket([)-shaped, generally rectangular-parallelopiped plate-shaped insulators 4, 5 are disposed at positions where those are parallel to the plate-shaped electrode 1 having the taper portion 1a, discharge-gas gas passages 6 and discharge-gas gas exhaust ports 7 are formed between the plate-shaped electrode 1 and the plate-shaped insulators 2, 3, and discharge-control-gas gas passages 8 and discharge-control-gas gas exhaust ports 9 are formed between the plate-shaped insulators 2, 3 and the plate-shaped insulators 4, 5, respectively. That is, a rectangular frame member is formed by the plate-shaped insulators 4, 5, and within the rectangular-parallelopiped space formed inside thereof, the plate-shaped insulators 2, 3 is disposed with a gap therebetween, and the plate-shaped electrode 1 is disposed between the plate-shaped insulators 2, 3 with a gap therebetween. As a result, the discharge-gas gas exhaust ports 7 of an identical rectangular shape are formed between the plate-shaped electrode 1 and the plate-shaped insulators 2, 3, and the discharge-control-gas gas exhaust ports 9 of an identical rectangular shape are formed between the plate-shaped insulators 4, 5 and the plate-shaped insulators 2, 3, respectively. The discharge-gas gas exhaust ports 7 and the discharge-control-gas gas exhaust ports 9 are disposed symmetrically on a boundary given by the tip of the taper portion 1a of the plate-shaped electrode 1 (i.e., a plane running through a center line of the plate-shaped electrode 1). Gas can be supplied generally perpendicularly to the processing object 12 to be processed via the gas exhaust ports 7, 9. By supplying a high-frequency power of, for example, 13.56 MHz from a high-frequency power supply 13 to the plate-shaped electrode 1 while supplying the gas from gas supply units 10, 11, a plasma is generated in a local plasma space PA, thus allowing the object 12 to be processed with a plasma. An example of this local plasma space PA is a generally rectangular-parallelopiped space which is formed under the plate-shaped electrode 1 and which has a width (a lateral size in FIG. 3) not larger than the thickness of the plate-shaped electrode 1 and a length (a vertical size in FIG. 3) generally equal to the length of the plate-shaped electrode 1. As an example, a distance "a" between the plate-shaped electrode 1 and the processing object 12 is 0.3 mm, widths "b", "c" and "d" of the plate-shaped electrode 1 and the plate-shaped insulators 2, 3, 4, 5 are both 1 mm, and widths "e", "f" of the gas passages 6, 8 are both 0.1 mm. Also, as an example, a line-direction length "h" is 30 mm for all of the plate-shaped electrode 1, the gas exhaust ports 7, and the gas exhaust ports 9. Also as an example, an angle of a pointing edge portion "i" in the taper portion 1a of the plate-shaped electrode 1 is 60°. Further, FIG. 4 shows an enlarged view of a vicinity of the taper portion 1a of the plate-shaped electrode 1. A one-dot chain line "o" is the center line of the plate-shaped electrode 1. A center of a line segment interconnecting a corner portion "p" of the plate-shaped electrode 1 and a corner portion "q" of the plate-shaped insulator 2 is assigned to one discharge-gas gas exhaust port 7 that is the nearer from the plate-shaped electrode 1, while a center of a line segment interconnecting a corner portion "r" of the plate-shaped insulator 2 and a corner portion "s" of the plate-shaped insulator 3 is assigned to the other gas exhaust port 9 farther from the plate-shaped electrode 1. In this case, a distance "t" between the plate-shaped electrode 1 and the gas exhaust ports 9 is 1.15 mm, and the distance between the gas exhaust ports 9 and the processing object 12 and the distance between the gas exhaust ports 7 and the processing object 12 have a distance difference "u" of 1 mm.

Also, the plate surface of the plate-shaped electrode 1 has a height "g" of 50 mm and a length "h" of 30 mm in the line direction. The plasma source, which is operable from several pascals to several atmospheres, operates typically within a range of 10000 Pa to about three atmospheres. In particular, the operation in the vicinity of the atmospheric pressure is especially preferable since neither strict sealed structure nor special exhaust unit is needed and the diffusion of plasma and activated particles is moderately restrained. Under the conditions that, as the gases, 1000 sccm of He is supplied as the discharge gas from the gas supply unit 10 via the gas passages 6 through the gas exhaust ports 7 and 500 sccm of $SF_6$ is supplied as the discharge control gas from the gas supply units 11 via the gas passages 8 through the gas exhaust ports 9, and that a high-frequency power of 100 W is supplied, an object-to-be-processed Si as the object 12 to be processed was subjected to an etching process. As a result, a plasma was generated only in the local plasma space PA, and thus, an etching profile shown in FIG. 5 was obtained. In this case, given a depth D of the most deeply etched portion, if the width of a portion shallower than the pattern bottom by D×0.8 is a processing width E, then E was 0.69 mm. Since the thickness of the plate-shaped electrode 1 of the plasma source is 1 mm, processing precision was great improved, as compared with the prior art example.

The reason why the processing precision was improved as shown above can be considered that expansion of discharge was suppressed by the introduction of $SF_6$, whose discharge-starting voltage is larger than that of He gas as the discharge gas exhausted through the gas exhaust ports 7, through the gas exhaust ports 9 as the discharge control gas.

It is noted here that the discharge control gas is a gas of large discharge-starting voltage, which is exemplified by a gas having a He concentration of less than 50%, or a gas having a property of suppressing discharge in the vicinity of the gas exhaust port that is farther than the plate-shaped electrode, or a gas having a property that the width of linear discharge becomes narrower than that of the case where no discharge control gas flow is used.

Furthermore, in the first embodiment of the present invention, coating the taper portion 1a of an aluminum plate-shaped electrode 1 with alumite as an insulator produces an effect of relaxing the concentration of electric fields, making it possible to improve the etching uniformity in the line direction except both ends of the taper portion 1a of the plate-shaped electrode 1.

Figure 6:
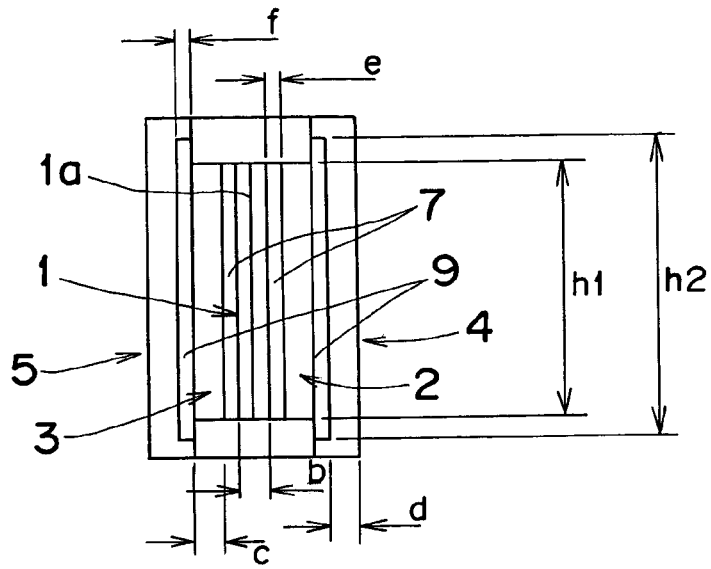
FIG. 6 is a plan view showing the construction of a plasma processing apparatus employed in a second embodiment of the present invention.
Figure 7A:
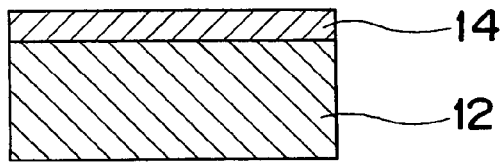
FIG. 7A is a view showing a patterning process employed in the prior art example.
Figure 7B:
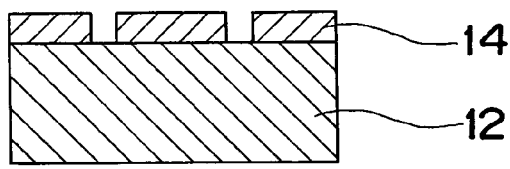
FIG. 7B is a view showing a patterning process employed in the prior art example.
Figure 7C:
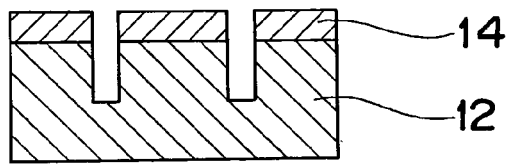
FIG. 7C is a view showing a patterning process employed in the prior art example.
Figure 7D:
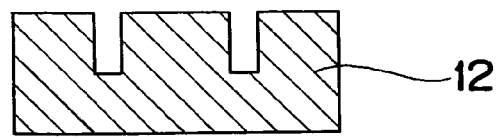
FIG. 7D is a view showing a patterning process employed in the prior art example.
Figure 8:
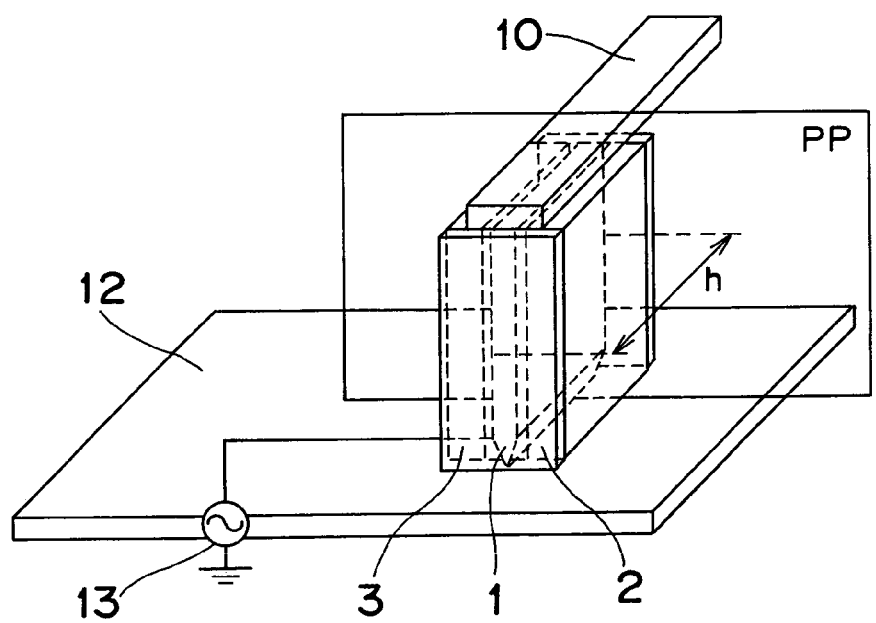
FIG. 8 is a perspective view showing the construction of a plasma processing apparatus employed in the prior art example.
Figure 9:
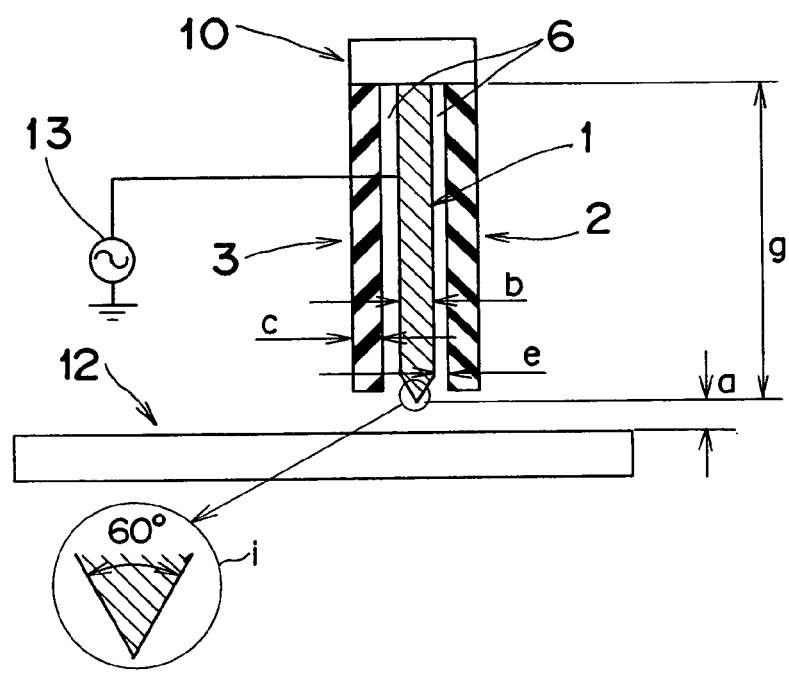
FIG. 9 is a sectional view showing the construction of the plasma processing apparatus employed in the prior art example.
Figure 10:
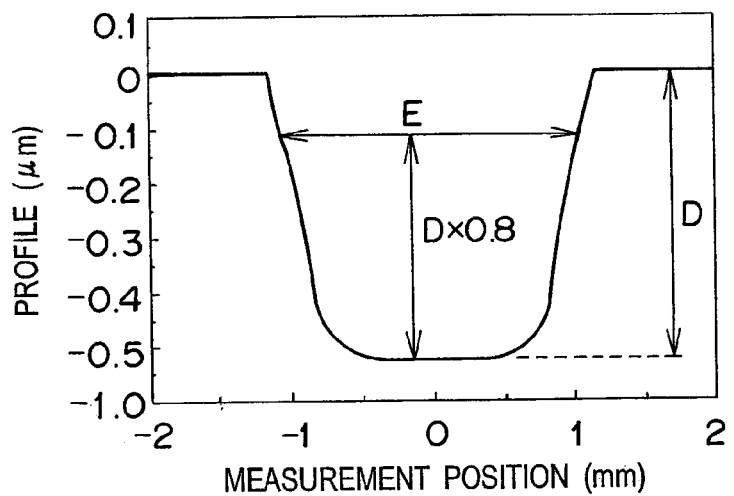
FIG. 10 is a graph showing an etching profile in the prior art example.

As a second embodiment of the present invention other than the first embodiment, it is also possible, as shown in FIG. 6, that while a line-direction length h1 of the gas exhaust ports 7 is set to 30 mm, a line-direction length h2 of the gas exhaust ports 9 is set to 40 mm, and that the line-direction opening length of one gas exhaust port 7 located nearer in distance from the plate-shaped electrode 1 is set smaller than the line-direction opening length of the gas exhaust port 9 located farther from the plate-shaped electrode 1, by which plasma processing can be carried out while the discharge control gas exhausted through the gas exhaust ports 9 is kept present at all times around the discharge gas exhausted through the gas exhaust ports 7. As a result, the etching rate at both ends of the taper portion of the plate-shaped electrode 1 can be suppressed, so that the etching uniformity in the line direction can be improved. Preferably, the line-direction length h1 of the gas exhaust port 7 is set 3 mm to 20 mm shorter than the length h2 of the gas exhaust port 9. Length differences smaller than 3 mm would cause the etching-rate suppression effect in the both ends of the taper portion of the plate-shaped electrode 1 to be smaller, thus undesirable. Also, length differences larger than 20 mm would cause increases in the amount of useless gas uncontributory to the processing-out of the supply amount of the discharge control gas, thus undesirable.

Figure 11:
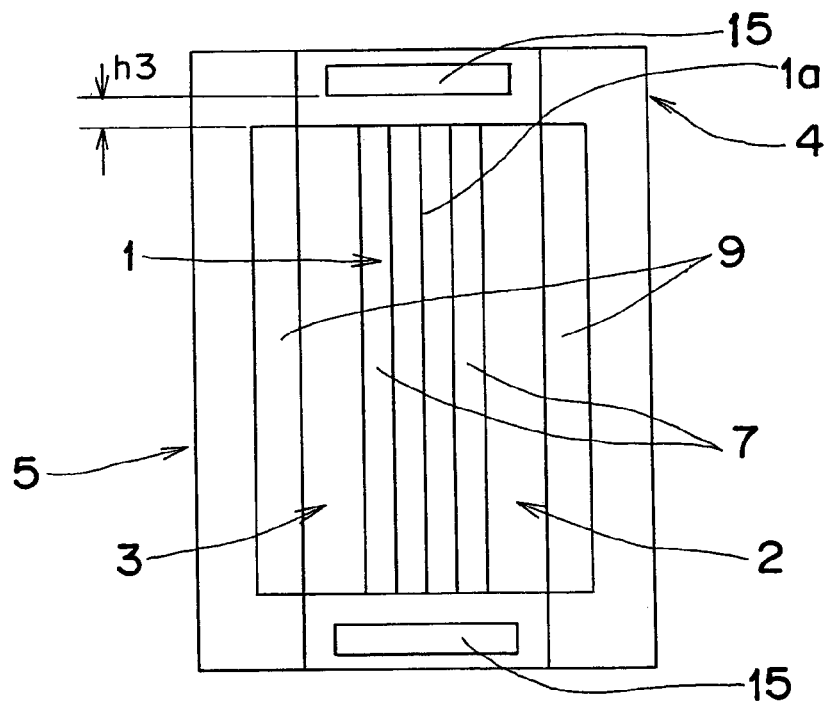
FIG. 11 is a plan view showing the construction of a plasma processing apparatus employed in a third embodiment of the present invention.

As a third embodiment still different from FIG. 6, it is also possible, as shown in FIG. 11, that the plate-shaped insulators 4, 5 have two lengthwise discharge-control gas exhaust ports 15, respectively, which are provided at positions distant from each other by a specified distance h3 in the lengthwise direction of the plate-shaped electrode 1 and each of which extends from the plate-shaped electrode 1-side over the discharge-gas gas exhaust ports 7 up to near the discharge-control-gas gas exhaust ports 9. By jetting out through the lengthwise discharge-control gas exhaust ports 15 a discharge control gas of the same kind as the gas assigned to the gas exhaust port 9 located farther from the plate-shaped electrode 1, it becomes possible to suppress the etching rate at both ends of the taper portion 1a of the plate-shaped electrode 1. Furthermore, the discharge control gas to be jetted out through the lengthwise discharge-control gas exhaust ports 15 may also be given by a discharge control gas of a different kind from that of the gas exhaust port 9 located farther from the plate-shaped electrode 1.

The foregoing embodiments of the present invention are described exemplarily on a case where the plasma source is given by the plate-shaped electrode 1 having the taper portion 1a. However, it is also possible to use various plasma sources such as inductively-coupling-type or other-type capillary-type ones, or micro-gap type ones.

Also, the foregoing embodiments are described exemplarily only on a case where the taper portion 1a of the plate-shaped electrode 1 is coated with an insulator by alumite processing. However, without being limited to this, the coating process may be CVD, sputtering, vapor deposition, thermal spraying, or Ceramecky coating process.

Also, the foregoing embodiments are described exemplarily only on a case where the inert gas to be supplied through the gas exhaust port located nearer from the plate-shaped electrode 1 is a gas composed mainly of He. However, any one of such gases as Ne, Ar, Kr, and Xe, which are inert gases other than He, are also usable.

Also, the foregoing embodiments are described exemplarily only on a case where the thickness of the plate-shaped electrode 1 is 1 mm. However, the thickness is not limited to this one. Yet, excessively small thicknesses of the plate-shaped electrode 1 would cause heavier wear due to plasma, while excessively large thicknesses of the plate-shaped electrode 1 would cause decreased concentration of electric fields, resulting in a decrease in processing speed as well as a difficulty in micro-fining the processing width. Accordingly, the thickness is preferably within a range of about 0.1 mm to 1.5 mm.

Further, the foregoing embodiments are described exemplarily only on a case where the distance between the plate-shaped electrode 1 and the gas exhaust port 9 farther from the plate-shaped electrode 1 is 1.15 mm. However, the distance is not limited to this. Yet, excessively large distances would cause decreases in the discharge-region suppression effect by the discharge control gas of large discharge-starting voltage supplied through the gas exhaust port 9 located farther from the plate-shaped electrode 1. On the other hand, a distance of appropriate nearness produces a large discharge-region suppression effect by the discharge control gas of large discharge-starting voltage, making it implementable to micro-fine the processing width. Accordingly, the distance is preferably below about 3 mm.

Further, when the distance between the plate-shaped electrode 1 and the gas exhaust port 9 farther from the plate-shaped electrode 1 is not more than about 1.2 mm, it becomes implementable to obtain a processing width smaller than the width of the plate-shaped electrode 1.

Further, the foregoing embodiments are described exemplarily only on a case where if the distance between the processing object 12 and the gas exhaust port 9 located farther from the plate-shaped electrode 1 is "m" and the distance between the processing object 12 and the gas exhaust port 7 located nearer from the plate-shaped electrode 1 is "k", then k−m=1 mm. However, the distance is not limited to this.

Yet, values of k−m smaller than 0 mm would cause decreases in the discharge-region suppression effect by the discharge control gas of large discharge-starting voltage supplied through the gas exhaust port 9 located farther from the plate-shaped electrode 1, while excessively larger values of k–m would cause excessively increased discharge-region suppression effect by the discharge control gas of large discharge-starting voltage, resulting in deteriorated plasma ignitability. On the other hand, distances of k–m which are larger than 0 mm and moreover appropriately small ones make it possible to obtain good plasma ignitability as well as finely narrow processing widths. Accordingly, the distance is preferably generally 0 mm<k–m≦3 mm.

Furthermore, given a distance "m" between the processing object 12 and the gas exhaust port 9 located farther from the plate-shaped electrode 1 and a distance "k" between the processing object 12 and the gas exhaust port 7 located nearer from the plate-shaped electrode 1, if 0 mm<k–m≦1 mm, then it becomes implementable to perform processing of processing widths smaller than the width of the plate-shaped electrode 1.

Further, it is also possible to supply DC power to the plasma source or the electrode 1 so that the plasma processing rates such as etching rate and film deposition rate can be enhanced. However, when the processing object 12 contains insulating material, AC power is desirable.

Also, the foregoing embodiments are described exemplarily only on a case where plasma processing is mainly performed with $SF_6$ gas used as the discharge control gas having a discharge-starting voltage larger than that of inert gas. However, the discharge control gas is not limited to this, and gases composed mainly of $CF_4$ gas, $O_2$ gas, $Cl_2$ gas, or the like can also be used for plasma processing.

Also, the foregoing embodiments are described exemplarily only on a case where the plasma processing is an etching process. However, the plasma processing is not limited to this, and the present invention is also applicable to various types of plasma processing such as plasma cleaning, CVD, sputtering, and plasma doping.

Also, the foregoing embodiments are described exemplarily on a case where the material of the processing object 12 for plasma processing is Si. However, the processing object 12 is not limited to these, and the present invention is applicable to the plasma processing of various types of substrates or the plasma processing of objects coated with various types of films. It is also possible to perform an etching process of resins or the like typified by photoresist or polyimide with the use of mixed gas of He and $O_2$. Further, it is also possible to continuously perform the plasma processing of a sheet-like object while the object is kept transferred by the roll-to-roll method. Otherwise, it is still also possible to perform thin film deposition by the plasma CVD method on the surface of various types of processing objects.

Also, the foregoing embodiments are described exemplarily on a case where a plasma is generated with a high-frequency power of 13.56 MHz. However, it is possible to generate a plasma with a high-frequency power within a range of several hundreds of kilohertz to several gigahertzs. Otherwise, it is also possible to generate a high-efficiency plasma by supplying a pulse power while a move to arc discharge is suppressed.

Also, the foregoing embodiments are described exemplarily only on a case where the electric power is applied to a plate-shaped electrode. However, the targeted object to which the electric power is applied is not limited to this, and similar effects can be obtained also when the electric power is applied to the object without being applied to the plate-shaped electrode, or when the electric power is applied to the object as well as to the plate-shaped electrode.

Fourth and following embodiments of the present invention relate to plasma processing apparatuses and methods, in particular, for forming fine patterns in the manufacture of micromachines or the like.

First, a conventional plasma processing apparatus is explained with reference to FIG. 22.

In the figure, a first electrode 101 and a second electrode 102 are disposed so as to face each other, and dielectrics 103, 104 formed of a 1 mm thick alumina plate or the like having a 0.05 mm deep groove are oppositely disposed between those electrodes 101, 102, by which a discharge space 105 having a width of 0.1 mm for plasma generation is formed. Further, with a high-frequency power supply 106 connected to the first electrode 101 via a matching circuit 107, a high-frequency power is applied to the first electrode 101 while the second electrode 102 is grounded, by which plasma discharge can be generated between the first electrode 101 and the second electrode 102.

Further, in the same figure, a gas exhaust port 108 is provided at one end of the discharge space 105 between the first electrode 101 and the second electrode 102, and connected to a gas supply unit 110 with gas piping 109, in which arrangement gas is introduced to between the first electrode 101 and the second electrode 102. Thus, by performing plasma discharge and by providing a jet-out port 111 for exerting plasma processing at an end face on one side opposite to the gas exhaust port 108, this plasma processing apparatus is enabled to implement various types of plasma processing such as etching, film deposition, or surface reforming on a processing object (an object to be processed) 112 set in close proximity to the jet-out port 111.

Figure 22:
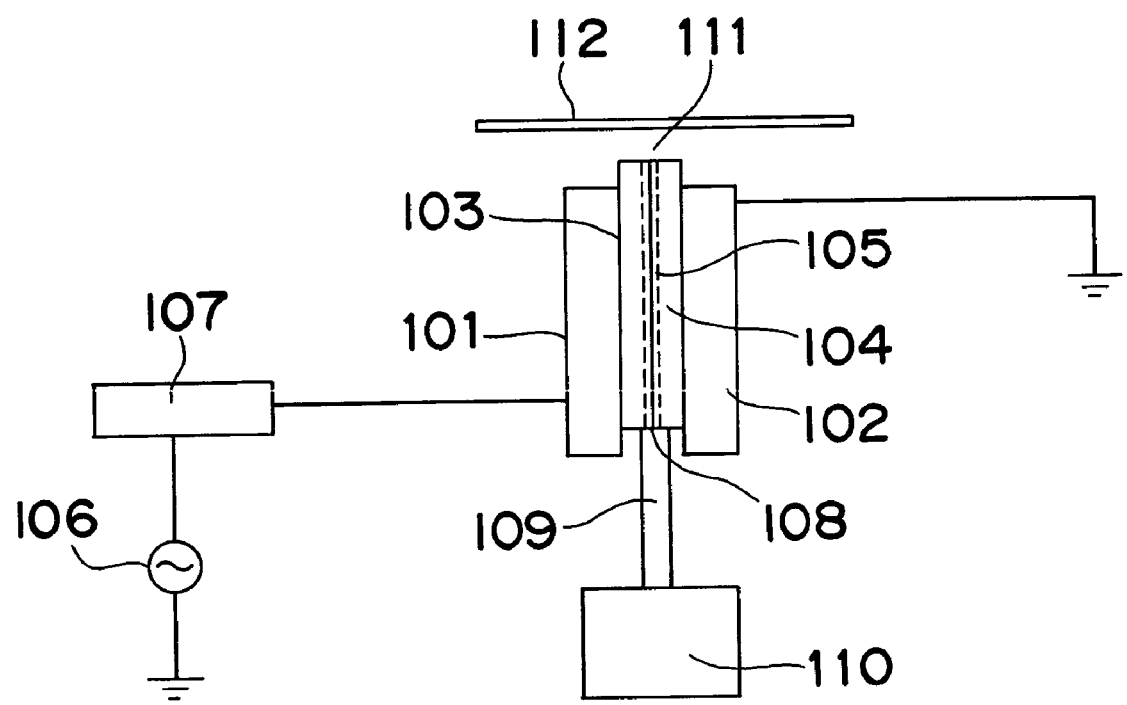
FIG. 22 is a sectional view showing the construction of a plasma processing apparatus used for the explanation of the prior art example.

However, in such a prior art technique as in FIG. 22, there has been an issue that bleeding would occur to the processed region of the processing object 112. The phenomenon of occurrence of bleeding is described in detail below.

Referring to FIG. 22, the surface region of the processing object 112 to be subjected to plasma processing is a region proximate to the jet-out port 111, and therefore it is expected that the opening configuration of the jet-out port 111 is transferred. However, radicals generated during plasma processing would diffuse from the plasma, tending to reach regions distant from the jet-out port 111. This would make the bleeding more likely to occur without the transfer of the opening configuration of the jet-out port 111.

In view of the above issues of the prior art, the fourth and following embodiments of the present invention have an object to provide plasma processing apparatus and method capable of implementing plasma processing superior in processing precision by controlling the diffusion of radicals to suppress the bleeding in the processing region of the substrate.

The fourth embodiment according to the present invention is first explained below with reference to FIGS. 12A to 15D.

Figure 12A:
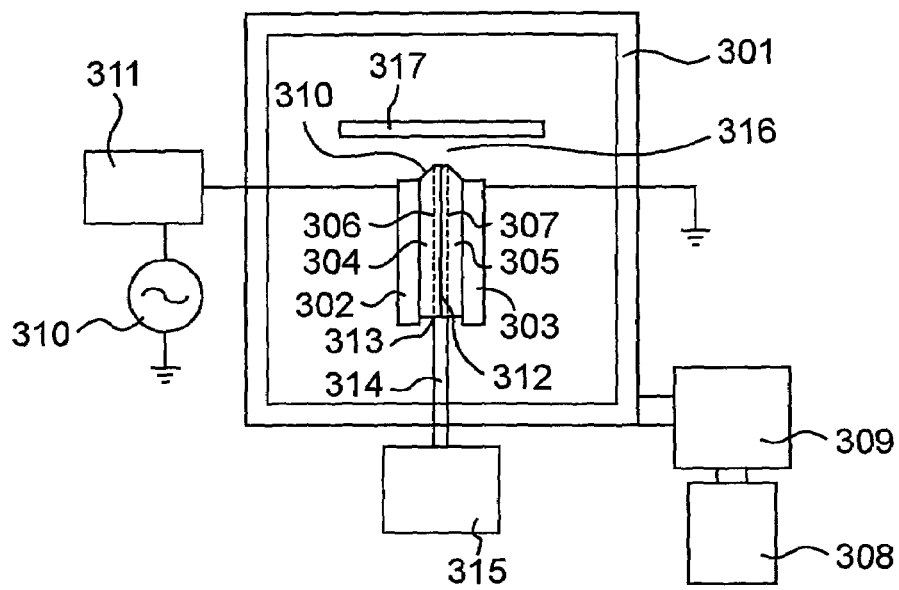
FIG. 12A is a partly-cross-sectional front view showing the construction of a plasma processing apparatus employed in a fourth embodiment of the present invention.
Figure 12B:
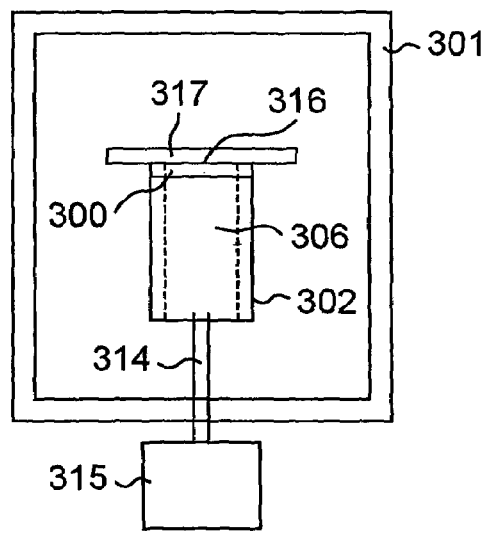
FIG. 12B is a partly-cross-sectional side view showing the construction of the plasma processing apparatus employed in the fourth embodiment of the present invention.
Figure 12C:
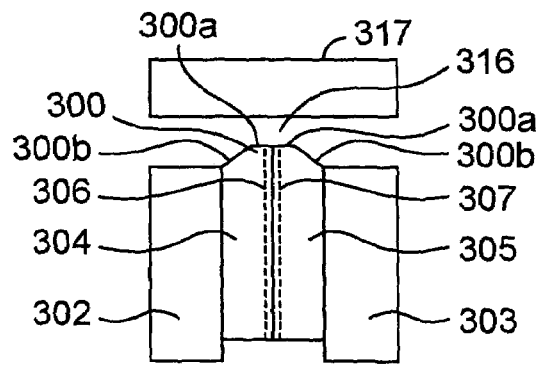
FIG. 12C is an enlarged view showing a part of the construction of the plasma processing apparatus employed in the fourth embodiment of the present invention.

FIGS. 12A to 12C show a plasma processing apparatus according to the fourth embodiment, where FIG. 12A is a partly-cross-sectional front view of the plasma processing apparatus, FIG. 12B is a partly-cross-sectional side view of the apparatus, and FIG. 12C is an enlarged view of a part of FIG. 12A.

Referring to FIG. 12A, in a sealable vacuum chamber 301 formed of an insulator, metal, or semiconductor, a plate-shaped first electrode 302 and a plate-shaped second electrode 303 are disposed so as to face each other, and dielectric plates 304, 305 each formed of, for example, a 1 mm thick ceramic or alumina plate or the like are disposed in close contact with the first electrode 302 and the second electrode 303, respectively. The dielectric plates 304, 305 have grooves 306, 307, respectively, formed so as to each have a width of 20 mm and a step gap of 0.05 mm, as an example. Also, a vacuum pump or other exhauster 308 is connected to the vacuum chamber 301 via a pressure-regulating unit 309, by which the internal pressure of the vacuum chamber 301 is made regulatable.

Further, with a high-frequency power supply 310 connected to the first electrode 302 via a matching circuit 311, a high-frequency power is applied to the first electrode 302 while the second electrode 303 is grounded, by which a plasma is generated in a 0.1 mm thick discharge space 312 formed by the grooves 306, 307.

In this case, a gas supply port 313 is provided at one end (lower end in FIG. 12A) of the rectangular-parallelopiped discharge space 312 formed of the grooves 306 and 307, and the gas supply port 313 is connected to a gas supply unit 315 with gas piping 314, in which arrangement a plasma is generated by introducing discharge gas to the discharge space 312. Moreover, a tapered taper portion 300 for performing plasma processing is provided at end portions (upper end portions in FIG. 12A) of the dielectric plates 304, 305 on one side opposite to the gas supply port 313, and a jet-out port (gas exhaust port) 316 forming the other end of the discharge space 312 is provided at an end face of the taper portion 300, by which this plasma processing apparatus is enabled to implement various types of plasma processing such as etching, film deposition, or surface reforming on a processing object (an object to be processed) 317 set in close proximity to the jet-out port 316.

The taper portion 300, as shown in FIG. 12C, is disposed at end portions of the dielectric plates 304, 305, and is made up of end faces 300a, 300a generally parallel to the opposing plane of the processing object 317 (or a plane serving as a reference for placing or support of the processing object 317), and taper surfaces 300b, 300b connecting the end faces 300a, 300a and the side faces to each other. The taper angle formed by the taper surface 300b of each taper portion 300 is desirably not less than 10° and not more than 80°. Taper angles less than 10° would cause excessively intense concentration of electric fields so that a move to arc discharge becomes more likely to occur, thus undesirable. Also, taper angles larger than 80° would cause lower concentration of electric fields as well as larger processing widths, thus undesirable. More preferably, the taper angle is desirably not less than 30° and not more than 70°. Within this range, the concentration of electric fields occur to an appropriate extent, so that narrow processing widths and a stable discharge state can be obtained.

Table 1 shows deviations of processing size from its target size, as a concrete example, on a case where with the same apparatus construction as in FIG. 12A, a plasma was generated under the conditions of a high-frequency power of 50 W, a gas supply of a mixed gas of helium gas and oxygen gas as the gas to be introduced into the vacuum chamber 301, the gas supply being supplied to the grooves 306 and 307, and a groove thickness (target size) of 0.1 mm, by which an organic film positioned 1 mm upper than the jet-out port 316 was etched.

TABLE 1

| | Deviation (mm) |
|---|---|
| (A) | −0.02 |
| (B) | +0.22 |

Figure 13:
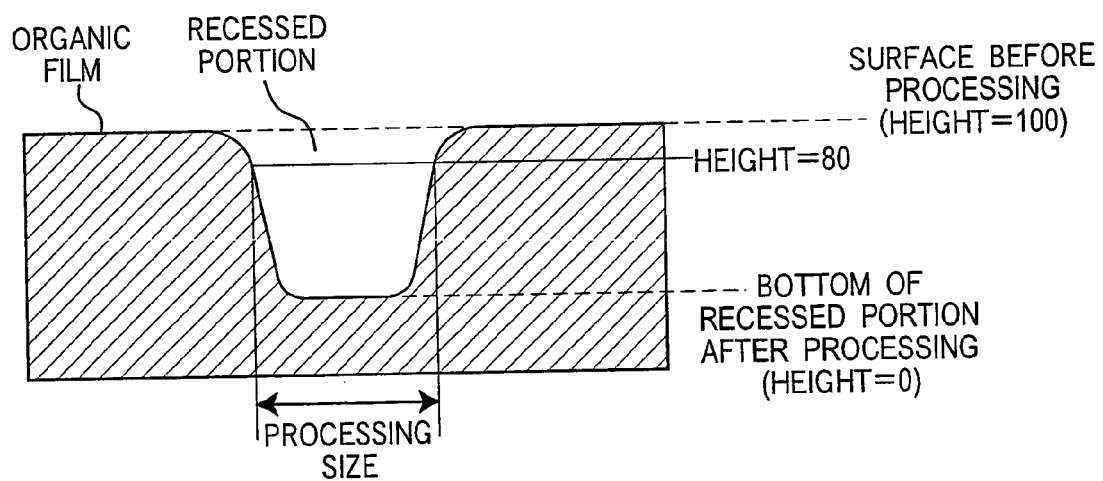
FIG. 13 is a sectional view of an organic film, showing the definition of deviations of working size from its target size employed in the fourth embodiment of the present invention.
Figure 14A:
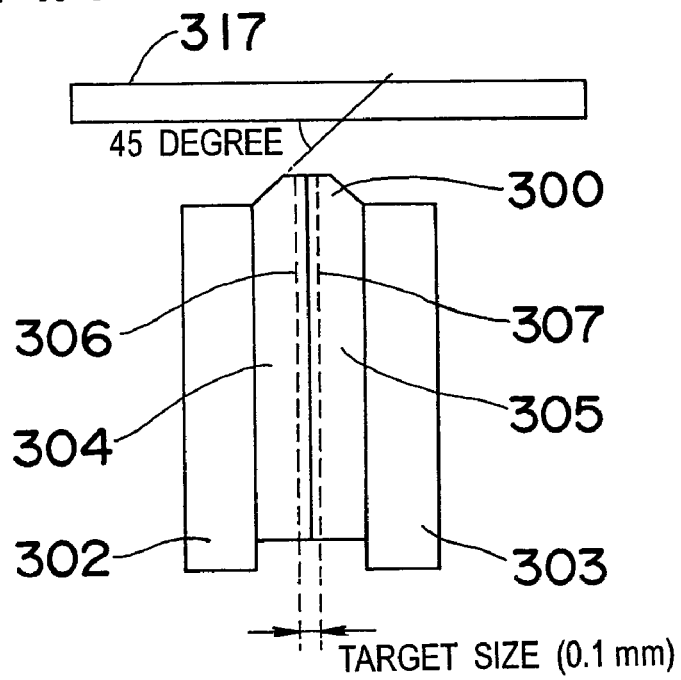
FIG. 14A is a front view showing the construction of the plasma processing apparatus employed in the fourth embodiment of the present invention.
Figure 14B:
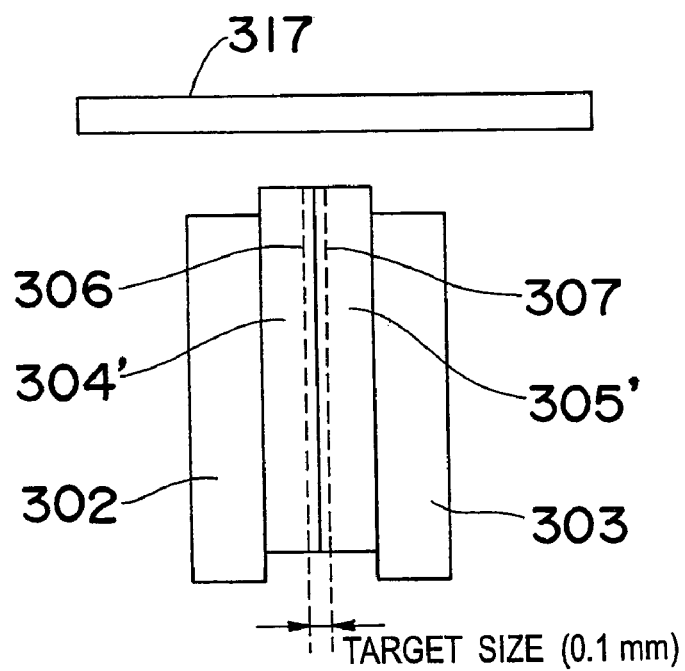
FIG. 14B is a front view showing the construction of a plasma processing apparatus without any tapered portion, which is used for a comparison to the plasma processing apparatus of the fourth embodiment of the present invention shown in FIG. 14A.

The processing sizes in Table 1, as shown in FIG. 13, show the width of a recessed portion at a height ratio of 80 in the cross-sectional configuration of a recessed pattern of an etched organic film, where the surface height ratio before processing is assumed to be 100 and the bottom height ratio of the recessed portion after the processing is assumed to be 0. Also, the case of (A) in Table 1 shows a case where a 45-degree taper working was performed on the outside of the taper portion 300 of the jet-out port as in the construction of the plasma processing apparatus shown in FIG. 14A. The case of (B) in Table 1 shows a case where no taper working was done without the provision of any taper portion outside the jet-out port as in the construction of the plasma processing apparatus shown in FIG. 14B. It is noted that in FIG. 14B, reference characters 304', 305' denote dielectric plates corresponding to the dielectric plates 304, 305, respectively, without the provision of the taper portion 300.

As apparent from Table 1, a targeted size of processing precision generally as it had been expected was obtained in Table 1 (A), whereas the resulting processing size was much larger than targeted in Table 1 (B). Images of plasma distributions and radical distributions during the processing for Table 1 (A) and (B) are shown in FIG. 15B (a position in FIG. 15B shows a position along the line X–X' of FIG. 15A) and in FIG. 15D (a position in FIG. 15D shows a position along the line X–X' of FIG. 15C).

Figure 15A:
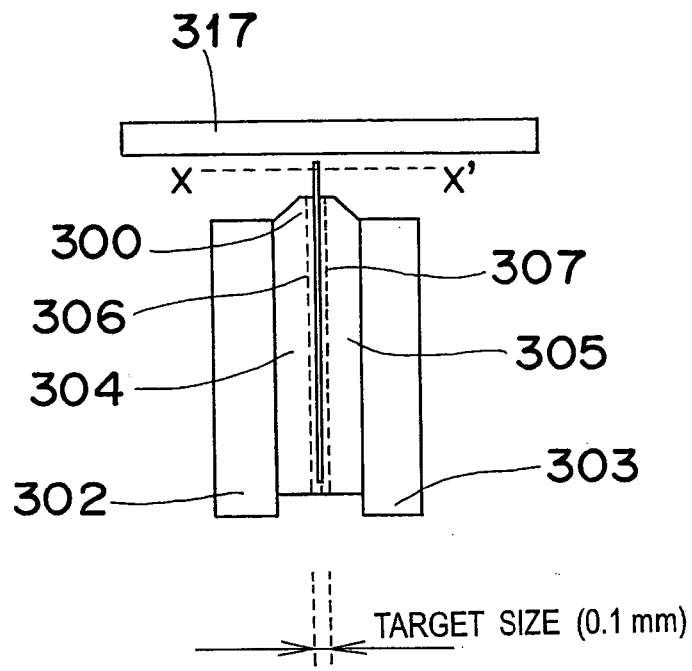
FIG. 15A is a sectional view showing the construction of the plasma processing apparatus employed in the fourth embodiment of the present invention.
Figure 15B:
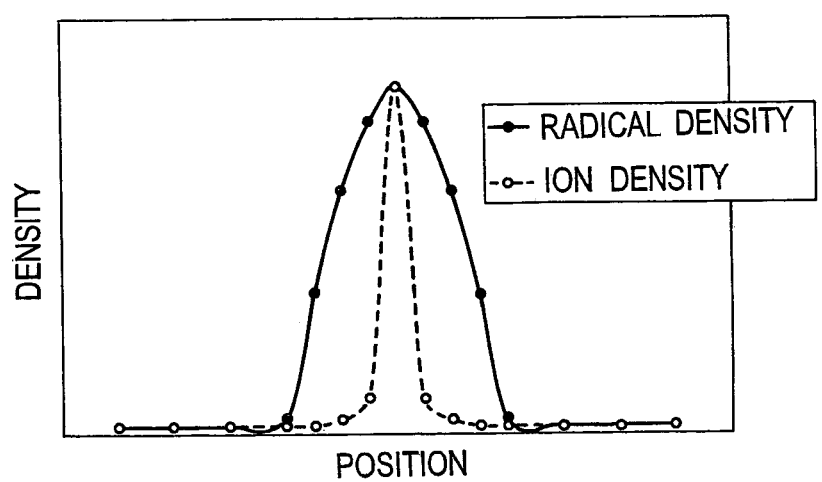
FIG. 15B is a graph showing a radical distribution in a plasma state by the plasma processing apparatus employed in the fourth embodiment of the present invention.
Figure 15C:
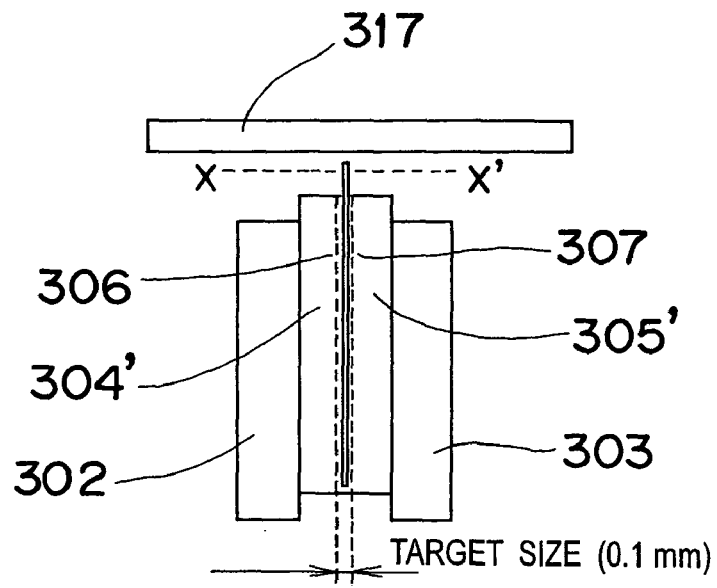
FIG. 15C is a sectional view showing the construction of the plasma processing apparatus without any tapered portion, which is employed for a comparison to the plasma processing apparatus employed in the fourth embodiment of the present invention.
Figure 15D:
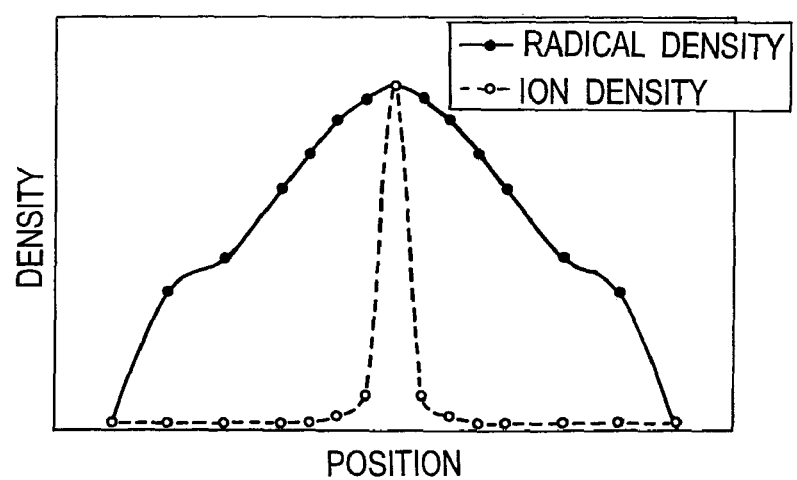
FIG. 15D is a graph showing a radical distribution in a plasma state by the plasma processing apparatus of FIG. 15C without any tapered portion.

Referring to FIGS. 15B and 15D, plasma and radicals are distributed to a width generally equal to the groove width in the graph of FIG. 15B, whereas the graph of FIG. 15D shows a processing result that the plasma is distributed to a width generally equal to the groove width, but that the radicals are distributed in spreading over the groove width. The reason of this could be considered that in the apparatus construction of FIG. 15C corresponding to the graph of FIG. 15D, the end faces of the dielectric plates 304', 305' are parallel to the surface of the processing object 317, where a narrow space is formed against the processing object 317 so that radicals are locally present at high concentration, while in the apparatus construction of FIG. 15A corresponding to the graph of FIG. 15B, there is present a space in which radicals are diffused because of the provisions of the taper portions 300, 300 at the end portions of the dielectric plates 304, 305 so that the localization of radicals is suppressed.

From the above-described constitutions, the jet-out port 316 is set in close proximity to the processing object 317, so that occurrence of bleeding in the regions to be processed can be suppressed over the first electrode 302 and the second electrode 303. In this case, the angle formed by the outer side face of the jet-out port 316 and the surface of the processing object 317, i.e., the taper angle of the taper surface 300b of the taper portion 300 has only to serve for such suppression that the radicals are locally present at high concentration as described above, where even a taper angle of 10 degrees produces an effect on the surface of the processing object, and a furthered angle of 80 degrees allows greater effects to be obtained. However, taper machining of the dielectric plates over 80 degrees is hard to implement and therefore inappropriate.

Also, the jet-out port 316 may have a portion (end face 300a) parallel to the processing object 317 for machining restraints. However, in this case, the parallel portion needs to be as small as possible, where setting the portion to 10% to 50% of the target size (groove thickness) allows high-precision etching to be implemented.

For a start of plasma discharge, a specified voltage corresponding to the pressure and the gap present between the first and second electrodes is needed. This is known as Paschen's law. According to Paschen's law, with respect to a pressure P of the discharge space and a thickness D of the discharge space, their product PD is defined, and then a voltage of not less than a minimum ignition voltage Vs corresponding to the product PD is applied to between the first and second electrodes opposed to each other, by which a plasma can be generated.

Applying an excessively high voltage to between the first and second electrodes opposed to each other would cause a move to arc discharge, resulting in a dangerous state such as damaged electrode. In the fourth embodiment, for safety's sake, the voltage to be applied to between the first and second electrodes opposed to each other was specified as 1 kV as an example, where it was satisfied that the ignition voltage Vs was not more than 1 kV with the product PD for air being within a range of about 0.1 (Pa·m) to 120 (Pa·m). Therefore, the processing was carried out under the condition that the product PD was within the range of 0.1 (Pa·m) to 120 (Pa·m). However, in the fourth embodiment, although an apparatus equipped with a chamber, an exhauster or the like is used so that various examinations for other purposes can be made, yet these are not necessarily required and, needless to say, the effects of the present invention can be obtained even if the processing is carried out outside the chamber.

In the above fourth embodiment, whereas the alumina plate is used as a dielectric, the dielectric is desirably one having a dielectric constant of not less than 4 in terms of matching simplicity for plasma generation. Also, since the dielectric is exposed to plasma, it is desirable to employ only one out of aluminum oxide, magnesium oxide, silicon oxide, zirconium oxide, aluminum nitride, and silicon nitride, which are high in plasma resistance.

Furthermore, the fourth embodiment are described on a case where the discharge gas to be introduced into the vacuum chamber 301 is given by helium gas and oxygen gas. However, plasma can be generated even if other rare gas(es) are used instead of helium gas. In particular, using helium as the rare gas is suitable for generation of plasma in a pressure region around atmospheric pressure, while using argon gas has a tendency of improving the processing precision. Depending on the processing precision, either one of them may be selected or those may be mixed.

Further, for implementation of film etching process, other gases that generate active radicals to those rare gases are favorably added thereto. Although the fourth embodiment are described only on a case of oxygen, using a halogen-element-containing gas that generate halogen radicals allows a relatively high processing speed to be obtained. Among halogen-element-containing gases, relatively easily available are fluorine, hydrogen fluoride, carbon tetrafluoride, methane trifluoride, butene octofluoride, sulfur hexafluoride, chlorine, hydrogen chloride, boron trichloride, boron tetrachloride, and the like. Besides halogen, hydrogen sulfide and the like that form sulfides may also be used.

Further, the fourth embodiment is described on a case where the electric power for the micro plasma source is supplied by a high-frequency (RF) power supply. However, a DC power supply may also be used. Further, in the case of an RF power supply, selecting a frequency of 400 kHz or higher as the applied frequency allows an easy start of discharge, and selecting a frequency of 500 MHz or lower allows an efficient suppression of discharge region to be implemented. Furthermore, pulsed power application of RF and DC power supplies allows chemical species in the plasma or their ratios to be changed, so that plasma processing with higher processing precision becomes achievable. As to the period of pulse application, those of not more than 1 µs lead to an increase in the exhaust efficiency of reaction products, thus allowing the chemical species in the plasma to be changed, but those of not more than 1 ms lead to a difficulty in pulse control, thus undesirable.

Accordingly, the period for pulse application is desirably 1 ms to 1 µs. Further, as to the duty ratio, which is a ratio of ON time in the pulse period, those of not more than 80% lead to an increase in the exhaust efficiency of reaction products, allowing the chemical species in the plasma to be changed, but those of not more than 1% lead to a difficulty in plasma retention, thus undesirable. That is, it is desirable to perform the processing at a duty ratio of 1% to 80%.

Also, in the fourth embodiment, the alumina plates 304, 305 having the grooves 306, 307, respectively, with a width of 20 mm and a step gap of 0.05 mm are opposed to each other, and the jet-out port 316 having a linear opening portion with a length of 20 mm and a width of 0.1 mm is formed, thus providing a linear-shaped processing region. By such formation of the jet-out port 316 having the linear opening portion, it becomes possible to carry out plasma processing over the linear region without changing the relative positions of the processing object 317 and the jet-out port 316. In this connection, if the opening-portion line width of the jet-out port 316 is within a range of not less than 1 mm or not more than 1 µm, then ignition voltage would become high around atmospheric pressure, making it impossible to implement a stable plasma processing. Therefore, the line width of the jet-out port 316 and the line width of the linear processing region are desirably within a range of 1 µm to 1 mm.

A fifth embodiment of the present invention is described with reference to FIGS. 16A and 16B.

Figure 16A:
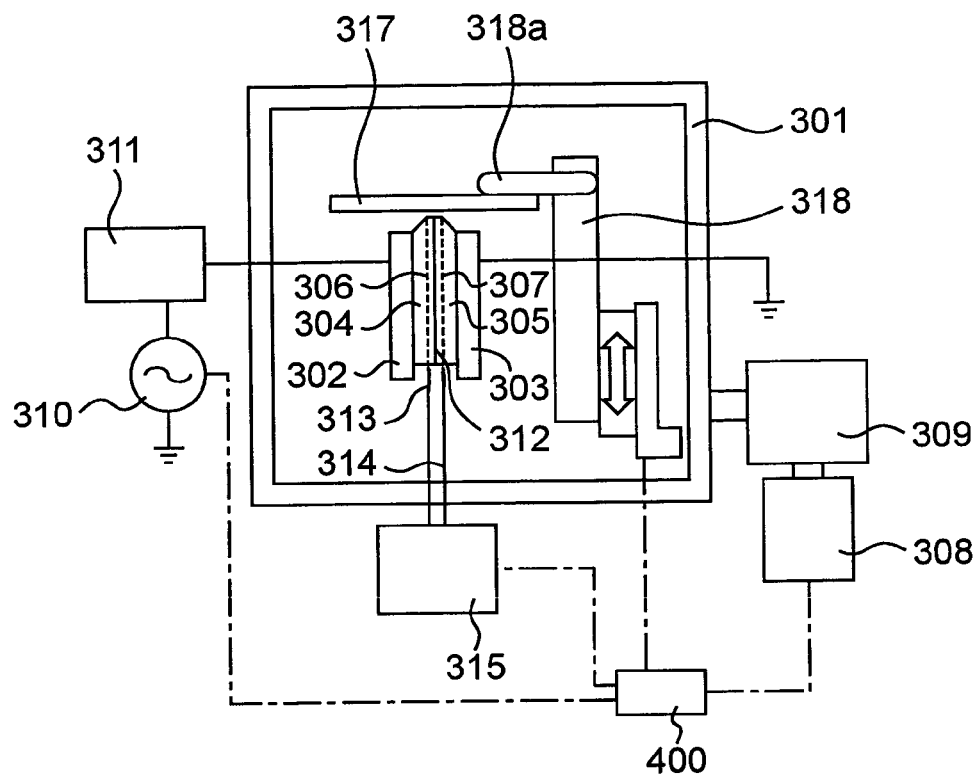
FIG. 16A is a partly-cross-sectional front view showing the construction of a plasma processing apparatus employed in a fifth embodiment of the present invention.
Figure 16B:
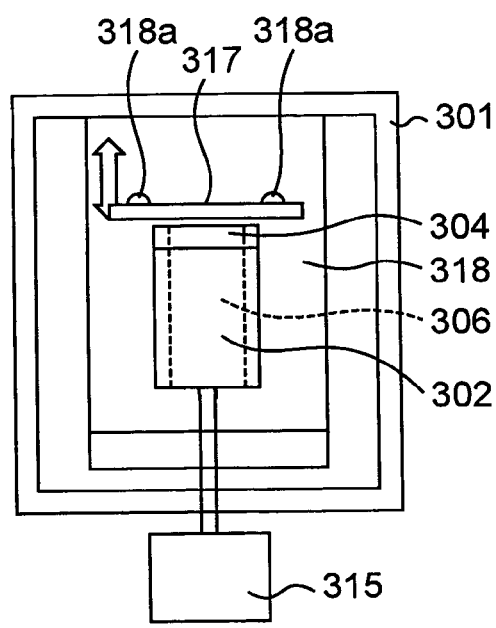
FIG. 16B is a partly-cross-sectional side view showing the construction of the plasma processing apparatus employed in the fifth embodiment of the present invention.

FIGS. 16A and 16B show a plasma processing apparatus which is similar to that of FIG. 12A but which differs therefrom in that the apparatus employs a processing-object-distance adjusting unit 318 equipped with a stage on which a processing object (an object to be processed) 317 is placed and which is capable of finely adjusting the processing object 317 in the vertical direction so that the relative distance between the processing object 317 and the jet-out port 316 is made variable.

FIG. 16A shows a partly-cross-sectional front view of the plasma processing apparatus according to the fifth embodiment, and FIG. 16B shows a partly-cross-sectional side view thereof. Spreading of radicals, which would cause a deterioration of processing precision, tends to occur when the relative distance between the processing object 317 and the jet-out port 316 is large. When the distance between the processing object 317 and the jet-out port 316 is small, radicals would be accumulated around the jet-out port 316 at high concentration. Therefore, in the fifth embodiment, the apparatus employs a processing-object-distance adjusting unit 318 like an X-Y table by which a pair of arms 318a for supporting the processing object 317 can be freely moved and adjusted in the vertical direction as viewed in FIGS. 16A and 16B with the aid of a slide mechanism so that the distance between the processing object 317 and the jet-out port 316 can be adjusted to an optimum distance.

Table 2 shows deviations of processing size from its target size on a case where with the same apparatus construction as in FIGS. 16A and 16B, the distance between the processing object 317 and the jet-out port 316 was changed by using the processing-object-distance adjusting unit 318, and where a plasma was generated under the conditions of a high-frequency power of 50 W, a gas flow of a mixed gas of helium gas and oxygen gas as the plasma processing gas supplied to the grooves 306 and 307, and a groove thickness (target size) of 0.1 mm, by which an organic film positioned upper than the jet-out port 316 was etched.

TABLE 2

| | Deviation (mm) |
|---|---|
| (A) | −0.02 |
| (B) | +0.18 |

The case of (A) in Table 2 shows a case where the relative distance between the processing object 317 and the jet-out port 316 is set to 1 mm by using the processing-object-distance adjusting control unit 318 while the case of (B) in Table 2 shows a case where the distance is set to 0.5 mm.

As apparent from Table 2, as to the processing precision, a size generally as had been targeted was obtained in (A) of Table 2, the result in (B) of Table 2 found to be spread much wider than the targeted size. This result shows that an optimum relative distance is determined by the quantity of actually flowing gas and the taper angle of the taper surface 300b. Therefore, based on information as to the quantity of actually flowing gas and the taper angle of the taper surface 300b, operation of the processing-object-distance adjusting unit 318 according to the fifth embodiment is controlled by a control unit 400, thereby making implementable to optimally control the distance between the processing object 317 and the jet-out port 316. It is noted that the control unit 400 is designed so as to control operations of the high-frequency power supply 310, the exhauster 308, and the gas supply unit 315 as well.

Further, the fifth embodiment is described in detail on a case where only the position of the processing object 317 is moved by using the processing-object-distance adjusting unit 318. However, it is needless to say that similar effects can be obtained whichever of the processing object 317 and the jet-out port 316 is set movable.

A sixth embodiment of the present invention is described in detail with reference to FIGS. 17A and 17B and FIGS. 18A to 18C.

Figure 17A:
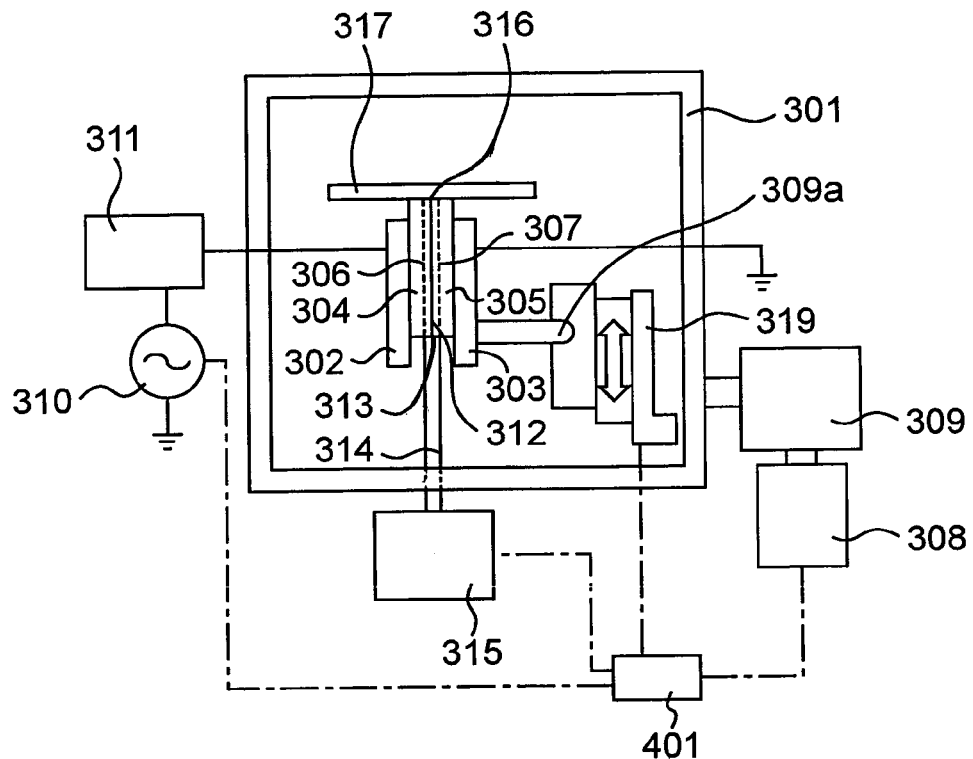
FIG. 17A is a partly-cross-sectional front view showing the construction of a plasma processing apparatus employed in a sixth embodiment of the present invention.
Figure 17B:
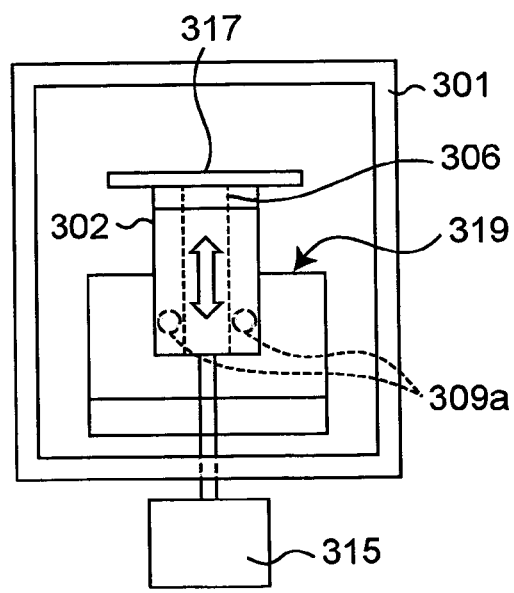
FIG. 17B is a partly-cross-sectional side view showing the construction of the plasma processing apparatus employed in the sixth embodiment of the present invention.

FIGS. 17A and 17B show a plasma processing apparatus which is similar to that of FIG. 12A but which is provided with an electrode-distance adjusting unit 319 equipped with a stage like an X-Y table coupled to the first electrode 302 and the second electrode 303 with a pair of coupling member 309a, 309a so as to be capable of finely adjusting only the first electrode 302 and the second electrode 303 in the vertical direction. Then, a relationship between deviations of processing size from its target size for the processing object 317, and processing speed, is preparatorily determined, and based on this relational information, operation of the electrode-distance adjusting unit 319 is controlled by a control unit 401 so that the relative distance from the first electrode 302 and the second electrode 303 to the jet-out port 316 can be optimally controlled. It is noted that the control unit 401 is designed so as to control operations of the high-frequency power supply 310, the exhauster 308, and gas supply unit 315 as well.

FIG. 17A is a partly-cross-sectional front view of the plasma processing apparatus according to the sixth embodiment, and FIG. 17B is a partly-cross-sectional side view thereof. Around the discharge space, it is considered that radicals become higher and higher in concentration with increasing closeness to the first electrode 302 and the second electrode 303. Therefore, the radical concentration is conditioned by the relative distance between the first electrode 302 and the processing object 317 or the relative distance between the second electrode 303 and the processing object 317.

The radical concentration increases as the distance between the processing object 317 and the first electrode 302 as well as the distance between the processing object 317 and the second electrode 303 decrease. Further, when the distance between the processing object 317 and the first electrode 302 as well as the distance between the processing object 317 and the second electrode 303 become smaller, there may occur, in some cases, higher-concentration localization of radicals as well. With respect to this issue, in the sixth embodiment, a relationships between deviations of processing size from its target size for the processing object 317, and processing speed, is preparatorily determined, and based on this relational information, adjustment control is performed with an electrode-distance adjusting unit 319 by a control unit 401 so that the distance between the first electrode 302 and the processing object 317 or the distance between the second electrode 303 and the processing object 317 can be optimally controlled.

Figure 18A:
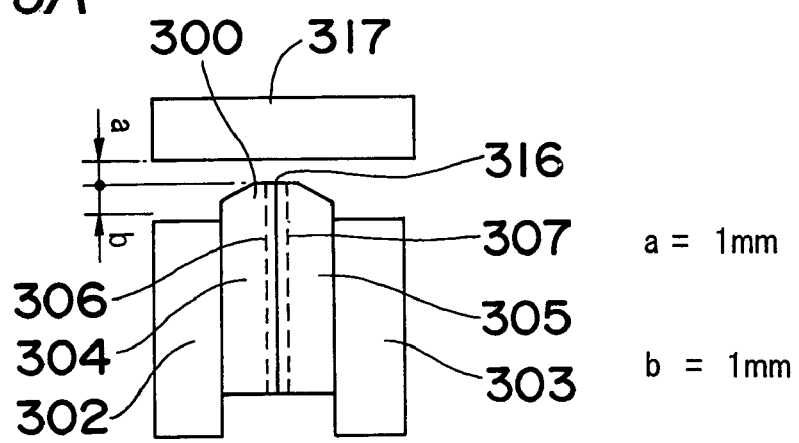
FIG. 18A is a sectional view showing the construction of the plasma processing apparatus employed in the sixth embodiment of the present invention.
Figure 18B:
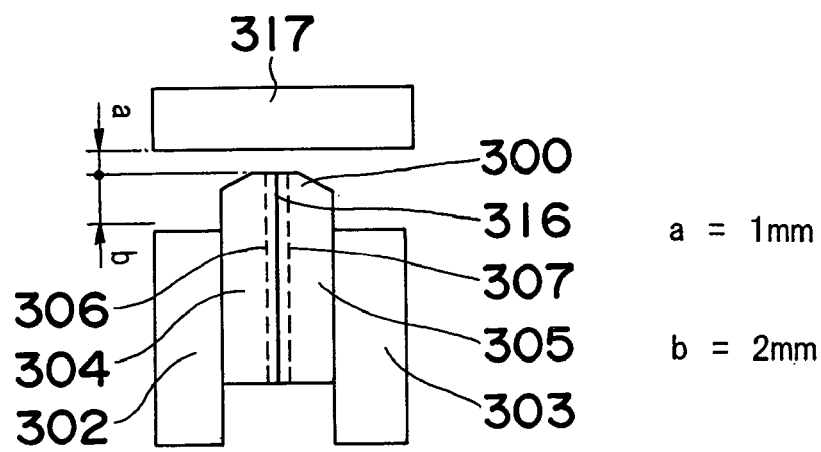
FIG. 18B is a sectional view showing the construction of the plasma processing apparatus employed in the sixth embodiment of the present invention.
Figure 18C:
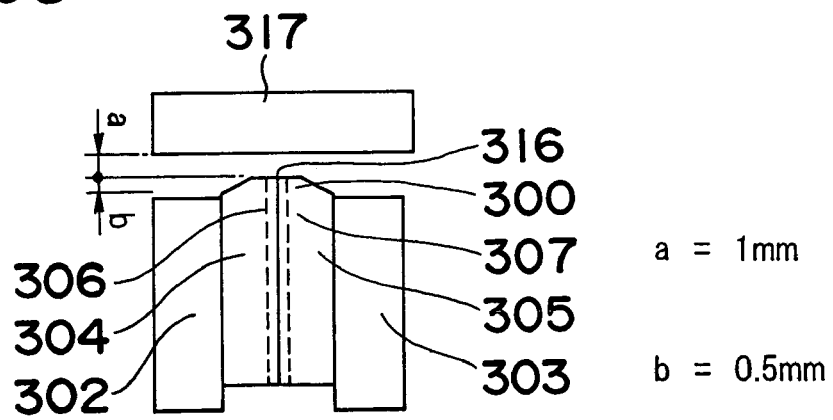
FIG. 18C is a sectional view showing the construction of the plasma processing apparatus employed in the sixth embodiment of the present invention.

The rows of (A) to (C) in Table 3 show deviations of processing size from its target size as well as processing speeds (rates) associated therewith, in a case where with such an apparatus construction as shown in FIGS. 18A to 18C, etching of an organic film was performed under the conditions that the distance between the processing object 317 and the jet-out port 316 (length indicated by a in FIGS. 18A to 18C) was maintained constant at 1 mm while the distance between the jet-out port 316 and an end face of the first electrode 302 as well as the distance between the jet-out port 316 and an end face of the second electrode 303 were changed.

TABLE 3

| | Deviation (mm) | Rate (µm/min) |
|---|---|---|
| (A) | −0.02 | 1.04 |
| (B) | +0.01 | 0.05 |
| (C) | +0.16 | 2.01 |

In this case, a high-frequency power of 50 W was applied and, as the plasma processing gas, a mixed gas of helium gas and oxygen gas was put into flow through the groove 306 and the groove 307. FIG. 18A shows a case where the distance between the jet-out port 316 and the end face of the first electrode 302 as well as the distance between the jet-out port 316 and the end face of the second electrode 303 (length indicated by "b" in FIGS. 18A to 18C) were set each to 1 mm, FIG. 18B shows a case where the distances were set each to 2 mm, and FIG. 18C shows a case where the distances were set each to 0.5 mm.

The case (A) in Table 3 resulted in a small deviation of processing size from the target size, which was an etching result generally as had been targeted, as well as a high value of processing speed, i.e. rate (µm/min.), which was 1 µm/min. The case of (B) in Table 3 showed results in which the deviation was not so different from that of (A) in Table 3, but the processing speed was a very low value of 0.05 µm/min. This could be attributed to a smaller quantity of radicals that had reached the processing object. The case of (C) in Table 3 showed results in which the processing speed was a very high rate of 2 µm as compared with that of (A) in Table 3 by virtue of the closeness of the electrode position to the processing object, while the deviation was a very large one such that the resulting processing precision was insufficient. In the sixth embodiment, as shown above, the relationship between deviations of processing size from its target size and processing speed is preparatorily determined, and based on this relational information, placement optimization is performed by using the electrode-distance adjusting unit 319 by the control unit 401. As a result, it becomes more easily implementable to satisfy high processing precision and high processing speed at the same time.

Next, a seventh embodiment of the present invention is described with reference to FIGS. 19A and 19B.

Figure 19A:
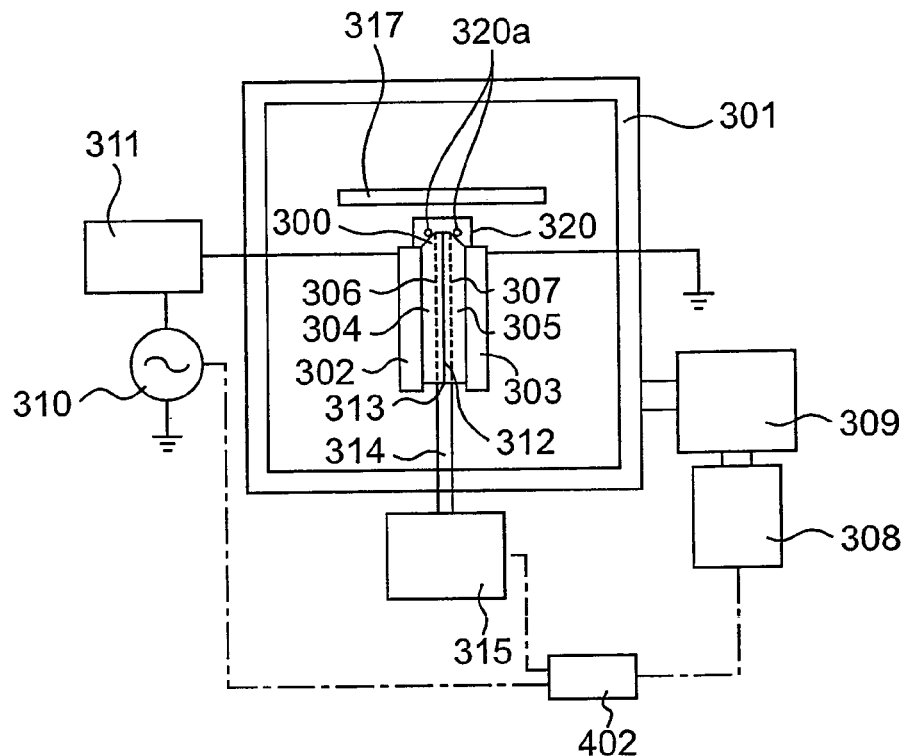
FIG. 19A is a partly-cross-sectional front view showing the construction of a plasma processing apparatus employed in a seventh embodiment of the present invention.
Figure 19B:
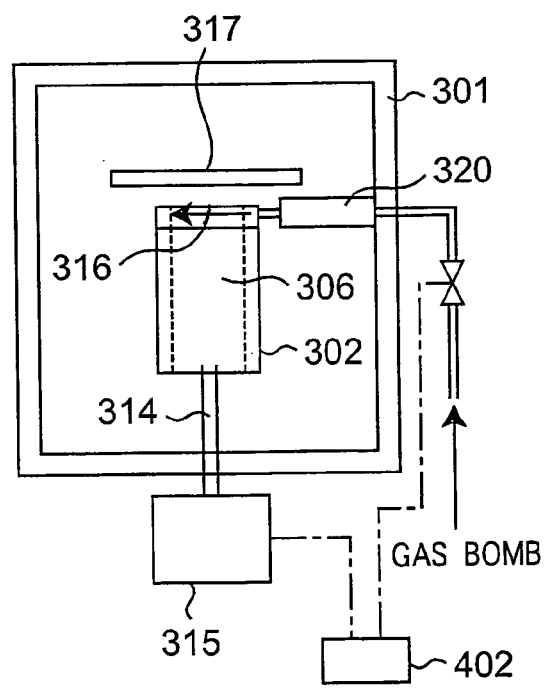
FIG. 19B is a partly-cross-sectional side view showing the construction of the plasma processing apparatus employed in the seventh embodiment of the present invention.

FIGS. 19A and 19B show an apparatus which is similar to that of FIG. 12A but which is provided with a discharge-control gas supply unit 320 by which a discharge control gas (processing region control gas) capable of reducing the radical concentration is exhausted from discharge-control gas exhaust ports 320a, 320a so as to be put into flow along outer surfaces of tapered portions of end faces of an alumina-plate dielectric plate 304 and an alumina-plate dielectric plate 305 in the vicinity of the jet-out port 316.

In this connection, FIG. 19A is a partly-cross-sectional front view of the apparatus, and FIG. 19B is a partly-cross-sectional side view thereof. From the provision of the taper portion 300 by taper machining of the end faces of the alumina-plate dielectric plate 304 and the alumina-plate dielectric plate 305 in the vicinity of the jet-out port 316, there is produced an effect that higher-concentration localization of radicals in the vicinity of the jet-out port 316 is suppressed. Furthermore, by controlling the plasma processing region with the discharge control gas put into flow from the discharge-control gas exhaust ports 320a, 320a toward the vicinities of the jet-out port 316 of the taper portion 300 under the operational control by means of a control unit 402, it becomes possible to accelerate the diffusion of radicals. It is noted that the control unit 402 is designed so as to control operations of the discharge control gas supply unit 320, the high-frequency power supply 310, the exhauster 308, and the gas supply unit 315.

Table 4 shows deviations of processing size from its target size on a case where etching of an organic film was performed with an apparatus construction similar to that of FIGS. 19A and 19B.

TABLE 4

| | Deviation (mm) |
|---|---|
| (A) | 0.00 |
| (B) | +0.06 |

In this case, a high-frequency power of 100 W was applied and, as the plasma processing gas (discharge gas), a mixed gas of helium gas and oxygen gas was put into flow through the groove 306 and the groove 307. The case of (A) in Table 4 shows a case where as an example of the discharge control gas, nitrogen gas was supplied from the discharge-control gas supply unit 320. The case of (B) in Table 4 shows a case where no discharge control gas was supplied. The case of (A) in Table 4 resulted in a small deviation of processing size from the target size, which was a processing result as had been targeted. However, the case of (B) in Table 4 resulted in a somewhat large deviation. The reason of this is considered that the case of (B) in Table 4 involved a large amount of radicals generated so that the radical concentration would not become sufficiently sparse even by the diffusion of radicals to the taper portion 300, which had caused occurrence of etching to the vicinity of the jet-out port 316. By contrast, in (A) in Table 4, it is considered that radicals were not localized to the taper portion 300, but diffused, by virtue of the flow of the discharge control gas.

In the seventh embodiment described above, nitrogen gas was used as the discharge control gas. However, gases other than those which easily yield plasma generation, such as helium, allows the processing-region suppression effect to be obtained, where argon, oxygen, and the like are effective.

Figure 20A:
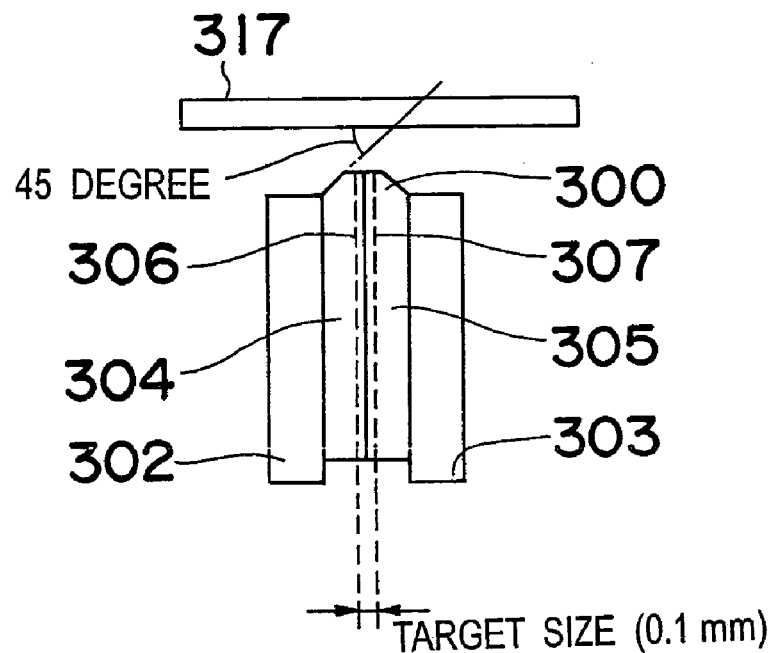
FIG. 20A is an explanatory view for explaining the plasma processing apparatus employed in the seventh embodiment of the present invention.
Figure 20B:
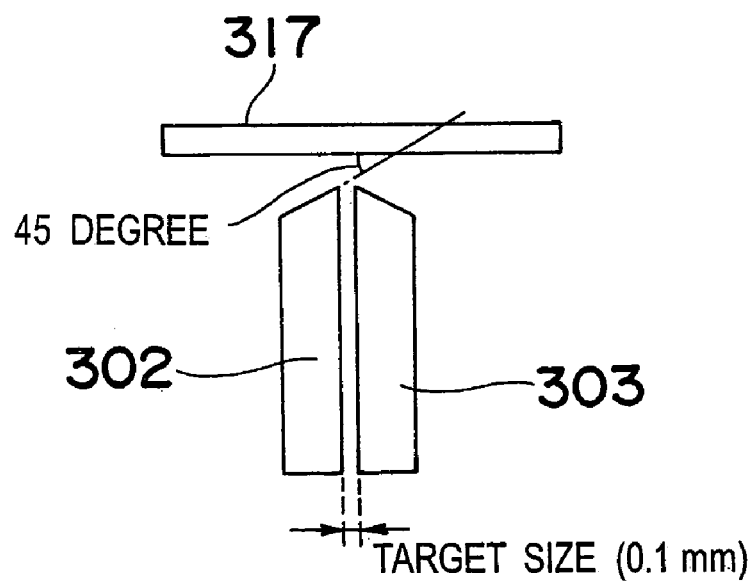
FIG. 20B is a front view showing the construction of the plasma processing apparatus used for the explanation of the seventh embodiment of the present invention.

Also, the seventh embodiment is described only on a case of a micro plasma source in which the discharge space between the electrodes 302 and 303 is formed by using the dielectrics 304 and 305. However, the dielectrics are used for such reasons as electrode protection. Needless to say, even with the structure other than the structure using the dielectrics shown in FIG. 20A, the same effects as in the case where the dielectrics are used can be obtained if the outer end-portion sections of sites of the electrodes 302, 303 corresponding to the jet-out ports are formed into a tapered configuration, also for cases where the discharge space is formed by the electrodes 302, 303 being disposed so as to be spaced from each other and opposite to each other as shown in FIG. 20B.

Next, an eighth embodiment of the present invention is described with reference to FIGS. 21A to 21C.

Figure 21A:
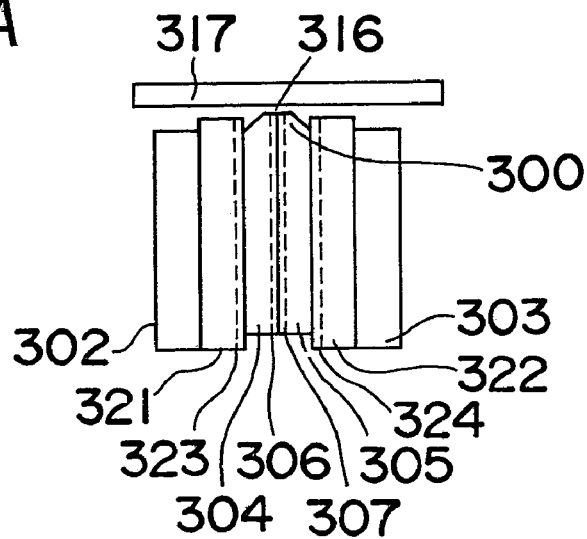
FIG. 21A is a front view showing the construction of a plasma processing apparatus employed in an eighth embodiment of the present invention.

FIG. 21A shows an apparatus which is similar to that of FIG. 19A but which is provided with two dielectric plates 321, 322 in addition to the structure of FIG. 19A. The dielectric plates 321 and the dielectric plate 322 each have a groove on the surface, with a discharge-control gas flow passage 323 provided between the dielectric plates 321 and the dielectric plate 304, and moreover with a discharge-control gas flow passage 324 provided between the dielectric plate 322 and the dielectric plate 305.

By putting a processing control gas into flow to the portions of those discharge-control gas flow passages 323, 324 from the discharge-control gas supply unit 320, the discharge control gas can be easily supplied to around the jet-out port 316, so that plasma processing of high processing precision can be carried out.

Figure 21B:
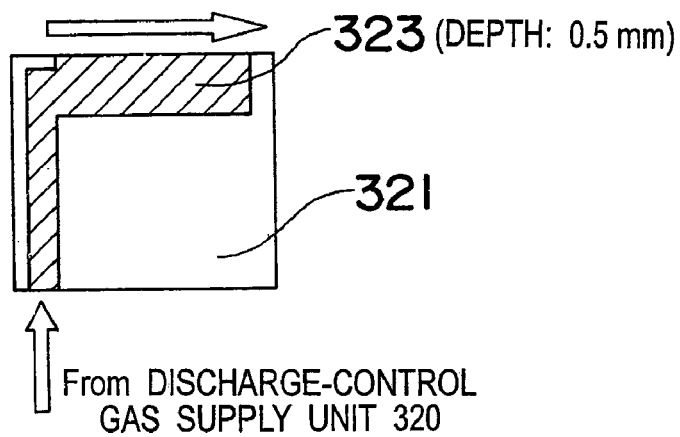
FIG. 21B is a side view showing the gas passage for discharge control of the dielectric plate in the plasma processing apparatus used for the explanation of the eighth embodiment of the present invention.
Figure 21C:
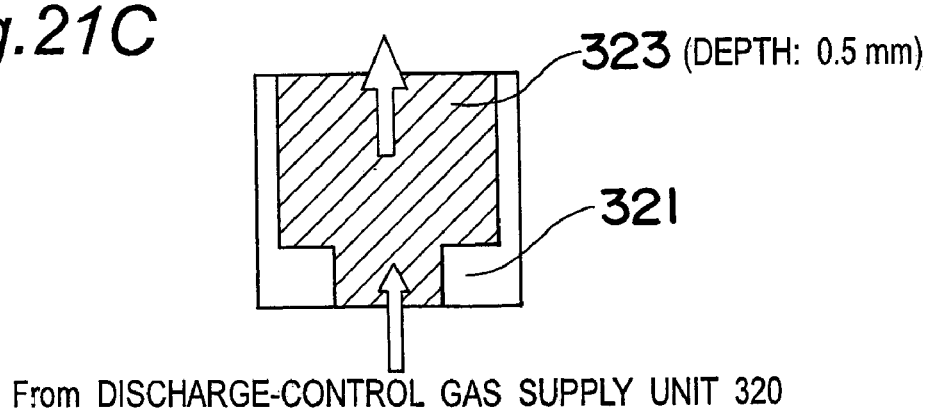
FIG. 21C is a side view showing the gas passage for discharge control of the dielectric plate in the plasma processing apparatus used for the explanation of the eighth embodiment of the present invention.

In FIGS. 21B and 21C, the portions of the grooves 323 of the dielectric plates 321 are depicted by hatching, respectively. As shown in FIG. 21B, the generally L-shaped discharge-control gas flow passage 323 is preparatorily machined in the dielectric plate 321, by which the discharge control gas can be put into flow in a direction vertical to the direction in which the plasma processing gas is jetted out at the jet-out port 316. Further, as shown in FIG. 21C, in the case where the discharge-control gas flow passage 323 is machined in the dielectric plate 321 in such a way that its width is larger in central to upper portions than in lower end portion, it becomes possible to make a flow of the discharge control gas in a direction vertical to the processing object 317. When the processing is carried out in the direction of FIG. 21B, there occurs less interference between the plasma processing gas and the discharge control gas, so that high processing precision can be obtained.

However, when helium alone is used as the rare gas in the plasma processing gas, there would be involved larger bleeding of the processing region. Therefore, by putting the discharge control gas vertically to the processing object surface as shown in FIG. 21C, high processing precision can be obtained.

In addition, combining any arbitrary embodiments together appropriately from among the foregoing various embodiments allows their respective effects to be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing apparatus comprising:
   a plate-shaped electrode;
   a plate-shaped insulator placed at a position where the plate-shaped insulator is adjacent to the plate-shaped electrode and where the plate-shaped insulator does not cover a part of a surface of the plate-shaped electrode confronting a processing object;
   an electric power supply unit for supplying electric power to the plate-shaped electrode or the processing object;
   a discharge-gas supply unit for supplying a discharge gas containing an inert gas to one gas exhaust port located nearer from the plate-shaped electrode, out of at least two-line gas exhaust ports which are disposed near the plate-shaped electrode and which are different in distance to the plate-shaped electrode from each other; and
   a discharge-control gas supply unit for supplying a discharge control gas, which is larger in discharge-starting voltage than the inert gas, to one gas exhaust port located farther from the plate-shaped electrode, out of the at least two-line gas exhaust ports which are disposed near the plate-shaped electrode and which are different in distance to the plate-shaped electrode from each other.

2. The plasma processing apparatus according to claim 1, wherein at least a surface of the plate-shaped electrode confronting the processing object has a taper portion.

3. The plasma processing apparatus according to claim 1, wherein a line-direction opening length of the gas exhaust port for the discharge gas located nearer from the plate-shaped electrode is smaller than a line-direction opening length of the gas exhaust port for the discharge control gas located farther from the plate-shaped electrode.

4. The plasma processing apparatus according to claim 1, wherein a part of a surface of the plate-shaped insulator confronting the processing object has a taper portion.

5. The plasma processing apparatus according to claim 1, wherein a distance between the processing object and the gas exhaust port for the discharge control gas located farther from the plate-shaped electrode is smaller than a distance between the processing object and the gas exhaust port for the discharge gas located nearer from the plate-shaped electrode.

6. The plasma processing apparatus according to claim 5, wherein assuming that the distance between the processing object and the gas exhaust port for the discharge control gas located farther from the plate-shaped electrode is m and that the distance between the processing object and the gas exhaust port for the discharge gas located nearer from the plate-shaped electrode is k, then it holds that $0 \text{ mm} < k-m \leq 1 \text{ mm}$.

* * * * *